US012813017B2

(12) United States Patent
Yoo

(10) Patent No.: US 12,813,017 B2
(45) Date of Patent: Nov. 24, 2026

(54) LIGHT EMITTING DIODE EMITTING LIGHT OF MULTI PEAK WAVELENGTHS

(71) Applicant: SEOUL VIOSYS CO., LTD., Ansan-si (KR)

(72) Inventor: Hong Jae Yoo, Ansan-si (KR)

(73) Assignee: SEOUL VIOSYS CO., LTD., Ansan-si (KR)

( * ) Notice: Subject to any disclaimer, the term of this patent is extended or adjusted under 35 U.S.C. 154(b) by 292 days.

(21) Appl. No.: 18/655,848

(22) Filed: May 6, 2024

(65) Prior Publication Data

US 2024/0379905 A1 Nov. 14, 2024

Related U.S. Application Data

(60) Provisional application No. 63/465,926, filed on May 12, 2023, provisional application No. 63/611,990, (Continued)

(51) Int. Cl.
*H10H 20/81* (2025.01)
*H10H 20/812* (2025.01)
(Continued)

(52) U.S. Cl.
CPC ........ *H10H 20/824* (2025.01); *H10H 20/812* (2025.01); *H10H 20/8162* (2025.01)

(58) Field of Classification Search
CPC . H10H 20/824; H10H 20/8162; H10H 20/812
(Continued)

(56) References Cited

U.S. PATENT DOCUMENTS 6,800,876 B2 10/2004 Edmond et al.
7,071,490 B2 7/2006 Edmond et al.
(Continued)

FOREIGN PATENT DOCUMENTS

CN 106531 867 A 3/2017
KR 10-2004-0014446 A 2/2004
(Continued)

OTHER PUBLICATIONS

International Search Report issued Aug. 21, 2024 in PCT/KR2024/006169 (with English Translation of Category of Cited Documents), 4 pages.

*Primary Examiner* — Phuc T Dang
(74) *Attorney, Agent, or Firm* — Oblon, McClelland, Maier & Neustadt, L.L.P.

(57) ABSTRACT

A light emitting diode according to an exemplary embodiment of the present disclosure includes a first conductivity type semiconductor layer; an active region including a barrier layer and a well layer; a strain control layer disposed between the first conductivity type semiconductor layer and the active region; a superlattice layer disposed between the strain control layer and the active region; a second conductivity type semiconductor layer disposed on the active region; and an electron blocking layer disposed between the active region and the second conductivity type semiconductor layer, in which the first conductivity type semiconductor layer and the well layer are represented by a predetermined formula, and a ratio of a mole fraction of In to a mole fraction of Ga in the first conductivity type semiconductor layer and a ratio of a mole fraction of In to a mole fraction of Ga in the well layer satisfy a predetermined equation.

20 Claims, 23 Drawing Sheets

Related U.S. Application Data filed on Dec. 19, 2023, provisional application No. 63/626,858, filed on Jan. 30, 2024.

(51) Int. Cl.
*H10H 20/816* (2025.01)
*H10H 20/824* (2025.01)

(58) Field of Classification Search
USPC .......................................................... 257/103
See application file for complete search history.

(56) References Cited

U.S. PATENT DOCUMENTS

| | | | |
|---|---|---|---|
| 7,692,209 | B2 | 4/2010 | Edmond et al. |
| 10,361,341 | B2 | 7/2019 | Danesh et al. |
| 10,566,499 | B2 | 2/2020 | Danesh et al. |
| 10,797,202 | B2 | 10/2020 | Danesh et al. |
| 11,611,018 | B2 | 3/2023 | Danesh et al. |
| 2023/0053144 | A1 | 2/2023 | Ali et al. |
| 2023/0053213 | A1 | 2/2023 | Ali et al. |
| 2023/0387350 | A1 | 11/2023 | Danesh et al. |

FOREIGN PATENT DOCUMENTS

| | | | | | |
|---|---|---|---|---|---|
| KR | 20140089707 | A | * | 7/2014 | ............... F21K 9/20 |
| KR | 10-2015-0046912 | A | | 5/2015 | |
| KR | 20180083596 | A | * | 7/2018 | ......... H01L 33/0066 |
| KR | 10-2019-0061088 | A | | 6/2019 | |
| KR | 20190061088 | A | * | 6/2019 | ............ H10W 90/00 |
| KR | 10-2022-0140749 | A | | 10/2022 | |

* cited by examiner

LIGHT EMITTING DIODE EMITTING LIGHT OF MULTI PEAK WAVELENGTHS

CROSS-REFERENCE TO RELATED APPLICATIONS

The present application claims priority to U.S. Provisional Application No. 63/465,926, filed May 12, 2023, U.S. Provisional Application No. 63/611,990, filed Dec. 19, 2023, and U.S. Provisional Application No. 63/626,858, filed Jan. 30, 2024, the entire contents of each of which is incorporated by reference herein in its entirety for all purposes.

TECHNICAL FIELD

The present disclosure relates to a light emitting diode and a light emitting apparatus including the same.

BACKGROUND

Implementation of various colors is used in various technical fields in daily life, and for example, various colors are implemented in various technical fields such as lighting, automobiles, light therapy, and displays.

In general, since a light emitting diode emits light having a single narrow full width at half maximum, it emits light of a single color in a visible light region. In order to implement various colors, a plurality of light emitting diodes having different peak wavelengths is used, or wavelength conversion materials such as phosphors are used together with the light emitting diodes. A package configuration including a plurality of light emitting diodes or light emitting diodes and phosphors has a complicated manufacturing process and has a limitation in space due to a relatively large size of the package. This configuration limits applications of conventional white LEDs.

Meanwhile, it is necessary to include a greater number of well layers to implement a white LED without a phosphor than the number of well layers constituting a conventional active layer, and in this structure, carrier dynamics of electrons and holes are important such that all well layers in the active layer participate in light emission.

Meanwhile, a compound semiconductor is used as a light source in a display apparatus, a traffic light, lighting, and an optical communication apparatus. A nitride semiconductor is mainly used in a light emitting diode or a laser diode that emits ultraviolet, blue, or green light.

The light emitting diode emitting blue and green light as an InGaN-based nitride semiconductor is widely used in lighting and display fields. The InGaN-based nitride semiconductor has attracted a lot of attention as a light source of blue and green light, especially in the field of large-area micro LED displays and head mounted displays (HMDs).

Meanwhile, a micro LED display apparatus requires red light along with blue and green light. Currently, a phosphide-based semiconductor is used as a red light source. However, the efficiency of a red light emitting diode using the phosphide-based semiconductor decreases as a light emitting area decreases, and further, since it is sensitive to temperature, it is not suitable for use in the field of the micro LED display. Moreover, since the phosphide-based red light emitting diode has a different light angle distribution compared to those of blue and green light emitting diodes, colors thereof changes depending on viewing angles.

SUMMARY

Exemplary embodiments of the present disclosure provide a monolithic light emitting diode configured to emit light of multiple peak wavelengths without using a phosphor.

Exemplary embodiments of the present disclosure provide a light emitting diode with a novel structure configured to implement light with a multi-band spectrum at a single chip level.

Exemplary embodiments of the present disclosure provide a monolithic light emitting diode configured to implement white light.

Exemplary embodiments of the present disclosure provide a nitride-based red light emitting diode.

Exemplary embodiments provide a light emitting diode with improved external quantum efficiency (EQE).

A light emitting device according to an exemplary embodiment of the present disclosure includes a first conductivity type semiconductor region; a second conductivity type semiconductor region; and a light emitting region disposed between the first conductivity type semiconductor region and the second conductivity type semiconductor region, in which the light emitting region includes a first light emitting portion, a second light emitting portion, and a separation layer disposed between the first light emitting portion and the second light emitting portion.

The first light emitting portion may be configured to emit green or yellow light, and the second light emitting portion may be configured to emit blue light.

The separation layer may include an Al(In)GaN layer.

An Al composition ratio of the separation layer that is closer to the first conductivity type semiconductor region may be equal to or greater than an Al composition ratio of the separation layer that is closer to the second conductivity type semiconductor region.

A minimum band gap energy in the separation layer is equal to or greater than a maximum band gap energy of the first light emitting portion and the second light emitting portion.

The separation layer may have a thickness within a range of 5 nm to 80 nm.

The separation layer may include an AlN layer and an AlGaN layer.

The AlN layer may be disposed closer to the first conductivity type semiconductor region than the AlGaN layer.

The AlGaN layer may include a constant composition layer or an inclination composition layer.

An Al composition ratio of the inclination composition layer may decrease from a first conductivity type semiconductor region side to a second conductivity type semiconductor region side.

An Al content in the AlGaN layer may be within a range of 10 atomic % to 30 atomic % with respect to that of an entire AlGaN layer.

The AlN layer may have a thickness within a range of 1 nm to 3 nm, and the AlGaN layer may have a thickness within a range of 10 nm to 50 nm.

The light emitting device may further include an electron blocking layer disposed between the light emitting region and the second conductivity type semiconductor layer, and the electron blocking layer may include a gallium nitride-based semiconductor layer containing Al.

In an embodiment, the separation layer may include Al(In)GaN, and an average Al composition ratio of the separation layer may be equal to or smaller than an average Al composition ratio of the electron blocking layer. Furthermore, the separation layer may have a thickness equal to or smaller than that of the electron blocking layer.

In another embodiment, the separation layer may include Al(In)GaN, and an average Al composition ratio of the separation layer may be equal to or greater than that of the electron blocking layer. Furthermore, the separation layer may have a thickness equal to or greater than that of the electron blocking layer.

The light emitting region may further include a third light emitting portion; and a second separation layer separating the third light emitting portion from the first and second light emitting portions.

The first light emitting portion and the second light emitting portion may be configured to emit light of a same color.

The separation layer may be formed without intentional doping.

A light emitting apparatus according to an exemplary embodiment of the present disclosure may include: a circuit board including an electrode; a light emitting device electrically connected to the circuit board; and a filling layer disposed over the light emitting device.

The light emitting device may include a first conductivity type semiconductor region; a second conductivity type semiconductor region; and a light emitting region disposed between the first conductivity type semiconductor region and the second conductivity type semiconductor region, in which the light emitting region may include a first light emitting portion, a second light emitting portion, and a separation layer disposed between the first light emitting portion and the second light emitting portion.

Light generated from the first light emitting portion may pass through the separation layer and the second light emitting portion to be emitted to the outside, and the second light emitting portion may be disposed between the first light emitting portion and the circuit board.

A light emitting apparatus according to an exemplary embodiment of the present disclosure may include: a circuit board including an electrode; a light emitting device electrically connected to the circuit board; and a filling layer disposed over the light emitting device.

The light emitting device may include a first conductivity type semiconductor region; a second conductivity type semiconductor region; and a light emitting region disposed between the first conductivity type semiconductor region and the second conductivity type semiconductor region, in which the light emitting region may include a first light emitting portion, a second light emitting portion, and a separation layer disposed between the first light emitting portion and the second light emitting portion.

Light generated from the first light emitting portion may pass through the separation layer and the second light emitting portion to be emitted to the outside, and the first light emitting portion may be disposed between the second light emitting portion and the circuit board.

A light emitting diode according to an exemplary embodiment of the present disclosure is a light emitting diode that is configured to emit red light, and includes a first conductivity type semiconductor layer; an active region including a barrier layer and a well layer; a strain control layer disposed between the first conductivity type semiconductor layer and the active region; a superlattice layer disposed between the strain control layer and the active region; a second conductivity type semiconductor layer disposed on the active region; and an electron blocking layer disposed between the active region and the second conductivity type semiconductor layer, in which the first conductivity type semiconductor layer and the well layer are represented by the following Formula (1), and a ratio of a mole fraction of In to a mole fraction of Ga in the first conductivity type semiconductor layer and a ratio of a mole fraction of In to a mole fraction of Ga in the well layer satisfy the following Equation (1):

[Formula (1)] AxByCzD(1-x-y-z) (where A is an element selected from Al, In, and Ga, B is an element selected from Al, In, and Ga, and C is an element selected from Al, In, and Ga, D is nitrogen, A, B, and C are different elements from one another, x+y+z=0.5, and 0≤x, y, z≤0.5); and [Equation (1)] 0.2≤(Min/Mga) well−(Min/Mga) first≤0.7.

The superlattice layer may include a lower superlattice layer and an upper superlattice layer, in which the lower superlattice layer and the upper superlattice layer may be formed of InGaN/GaN, and an In content of the upper superlattice layer may be higher than that of the lower superlattice layer.

An InGaN layer in the lower superlattice layer may be thicker than an InGaN layer in the upper superlattice layer.

Furthermore, the upper superlattice layer may be thicker than the lower superlattice layer.

The ratio of the mole fraction of In to the mole fraction of Ga in the well layer and a ratio of a mole fraction of In to a mole fraction of Ga in the barrier layer in contact with the well layer may satisfy the following Equation (2): [Equation (2)] 0.2≤(Min/Mga) well-(Min/Mga) barrier≤0.7.

The active region includes n well layers and n+1 barrier layers, and a sum of differences between a ratio of a mole fraction of In to a mole fraction of Ga in each well layer and a ratio of a mole fraction of In to a mole fraction of Ga in the barrier layer in contact with each well layer may satisfy the following Equation (3): [Equation (3)] 0.2≤ {(Min/Mga) well_1−(Min/Mga) barrier_1 or 2}+ . . . + (Min/Mga) well_n−(Min/Mga) barrier_n or n+1)}≤7.

The ratio of the mole fraction of In to the mole fraction of Ga in the well layer and a ratio of a mole fraction of In to a mole fraction of Ga in the electron blocking layer may satisfy the following Equation (4): Equation (4)) 0.2≤ (Min/Mga) well−(Min/Mga) EBL≤0.7.

A ratio of a mole fraction of Al to the mole fraction of Ga in the well layer and a ratio of a mole fraction of Al to the mole fraction of Ga in the electron blocking layer may satisfy the following Equation (5): [Equation (5)] (Mal/Mga) well-(Mal/Mga) EBL<0.

The ratio of the mole fraction of In to the mole fraction of Ga in the electron blocking layer and the ratio of the mole fraction of In to the mole fraction of Ga in the first conductivity type semiconductor layer may satisfy the following Equation (6): [Equation (6)] (Min/Mga) EBL−(Min/Mga) first>0.

The ratio of the mole fraction of Al to the mole fraction of Ga in the electron blocking layer and a ratio of a mole fraction of Al to the mole fraction of Ga in the first conductivity type semiconductor layer may satisfy the following Equation (7): [Equation (7)] (Mal/Mga) EBL−(Mal/Mga) first>0.

A difference between the ratio of the mole fraction of In to the mole fraction of in the electron blocking layer and the ratio of the mole fraction of In to the mole fraction of Ga in the first conductivity type semiconductor layer, and a difference between the ratio of the mole fraction of Al to the mole fraction of Ga in the electron blocking layer and the ratio of the mole fraction of Al to the mole fraction of Ga in the first conductivity type semiconductor layer may satisfy the following Equation (8): [Equation (8)] (Min/Mga) EBL−(Min/Mga) first< (Mal/Mga) EBL−(Mal/Mga) first.

A ratio of a mole fraction of In to a mole fraction of Ga in the second conductivity type semiconductor layer and the ratio of the mole fraction of In to the mole fraction of Ga in the well layer may satisfy the following Equation (9): [Equation (9)] 0.2≤ (Min/Mga) well-(Min/Mga) second≤0.7.

The ratio of the mole fraction of In to the mole fraction of Ga in the second conductivity type semiconductor layer and the ratio of the mole fraction of In to the mole fraction of Ga in the electron blocking layer may satisfy the following Equation (10): [Equation (10)] (Min/Mga) EBL−(Min/Mga) second>0.

A ratio of a mole fraction of Al to the mole fraction of Ga in the second conductivity type semiconductor layer and a ratio of a mole fraction of Al to the mole fraction of Ga in the electron blocking layer may satisfy the following Equation (11): [Equation (11)] (Mal/Mga) EBL−(Mal/Mga) second>0.

A difference between the ratio of the mole fraction of In to the mole fraction of Ga in the electron blocking layer and the ratio of the mole fraction of In to the mole fraction of Ga in the second conductivity type semiconductor layer, and a difference between the ratio of the mole fraction of Al to the mole fraction of Ga in the electron blocking layer and the ratio of the mole fraction of Al to the mole fraction of Ga in the second conductivity type semiconductor layer may satisfy the following Equation (12): [Equation (12)] (Min/Mga) EBL−(Min/Mga) second< (Mal/Mga) EBL−(Mal/Mga) second.

The electron blocking layer may include a lower layer in contact with the active region, an upper layer in contact with the second conductivity type semiconductor layer, and an intermediate layer disposed between the lower layer and the upper layer, in which the lower layer, the intermediate layer, and the upper layer may be a nitride-based semiconductor layer having a different composition from one another.

The upper layer may be a grading layer in which a content of Al decreases as a distance from the active region increases.

The lower layer may be an AlN layer, the intermediate layer may be an InAlGaN layer, and the upper layer may be an AlGaN grading layer.

The red light may have a peak wavelength within a range of 600 nm to 720 nm.

The light emitting diode may further include contact electrodes respectively in contact with the first conductivity type semiconductor layer and the second conductivity type semiconductor layer.

A light emitting diode according to an exemplary embodiment of the present disclosure includes: a substrate; a first type nitride semiconductor layer disposed on the substrate; a sub-active layer disposed on the first type nitride semiconductor layer; a main active layer disposed on the sub-active layer; an electron blocking layer disposed on the main active layer; and a second type nitride layer disposed on the electron blocking layer.

DETAILED DESCRIPTION OF EMBODIMENTS

Figure 1:
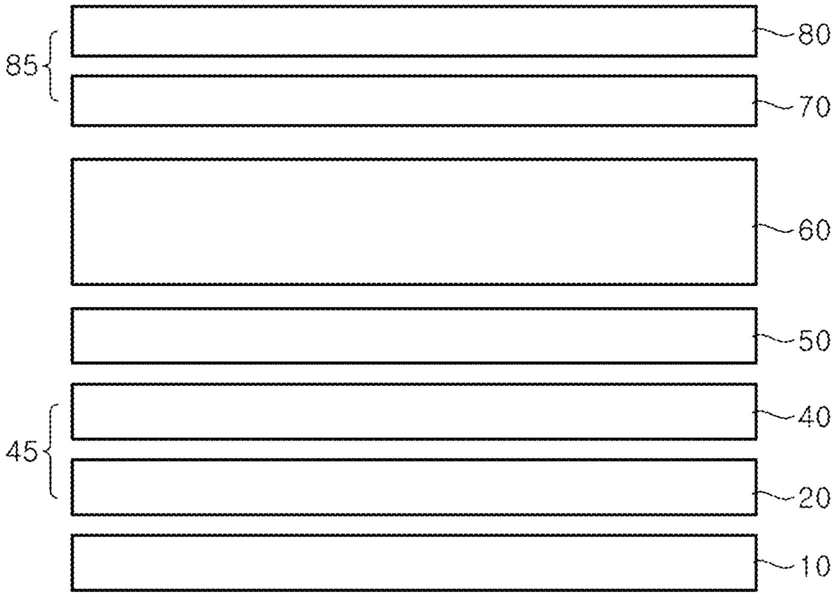
FIG. 1 is a schematic cross-sectional view illustrating a light emitting device according to an exemplary embodiment of the present disclosure.

In the following description, for the purposes of explanation, numerous specific details are set forth in order to provide thorough understanding of various exemplary embodiments or implementations of the present disclosure. As used herein, "embodiments" and "implementations" are interchangeable terms for non-limiting examples of devices or methods employing one or more of the inventive concepts disclosed herein. It will be apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects (hereinafter individually or collectively referred to as "elements") of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, and property of the elements, unless specified. Further, in the accompanying drawings, the size and relative sizes of elements may be exaggerated for clarity and/or descriptive purposes. When an exemplary embodiment is implemented differently, a specific process order may be performed differently from the described order. For example, two consecutively described processes may be performed substantially at the same time or performed in an order opposite the described order. In addition, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the DR1-axis, the DR2-axis, and the DR3-axis are not limited to three axes of a rectangular coordinate system, such as the x, y, and z-axes, and may be interpreted in a broader sense. For example, the DR1-axis, the DR2-axis, and the DR3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," and the like may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (for example, as in "sidewall"), and the like, may be used herein for descriptive purposes, and, thereby, to describe one element's relationship to other element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (for example, rotated 90 degrees or at other orientations), and, as such, the spatially relative descriptors used herein may likewise interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

As customary in the field, some exemplary embodiments are described and illustrated in the accompanying drawings in terms of functional blocks, units, and/or modules. Those skilled in the art will appreciate that these blocks, units, and/or modules are physically implemented by electronic (or optical) circuits, such as logic circuits, discrete components, microprocessors, hard-wired circuits, memory elements, wiring connections, and the like, which may be formed using semiconductor-based fabrication techniques or other manufacturing technologies. In the case of the blocks, units, and/or modules being implemented by microprocessors or other similar hardware, they may be programmed and controlled using software (for example, microcode) to perform various functions discussed herein and may optionally be driven by firmware and/or software. It is also contemplated that each block, unit, and/or module may be implemented by dedicated hardware, or as a combination of dedicated hardware to perform some functions and a processor (for example, one or more programmed microprocessors and associated circuitry) to perform other functions. Also, each block, unit, and/or module of some exemplary embodiments may be physically separated into two or more interacting and discrete blocks, units, and/or modules without departing from the scope of the inventive concepts. Further, the blocks, units, and/or modules of some exemplary embodiments may be physically combined into more complex blocks, units, and/or modules without departing from the scope of the inventive concepts.

Unless otherwise defined, all terms (including technical and scientific terms) used herein have the same meaning as commonly understood by one of ordinary skill in the art to which this disclosure pertains. Terms, such as those defined in commonly used dictionaries, should be interpreted as having a meaning that is consistent with their meaning in the context of the relevant art and should not be interpreted in an idealized or overly formal sense, unless expressly so defined herein.

FIG. 1 is a schematic cross-sectional view illustrating a light emitting device according to an exemplary embodiment of the present disclosure.

Referring to FIG. 1, the light emitting device according to this embodiment may include a base 10, a buffer layer 20, a first conductivity type semiconductor layer 40, a control portion 50, a light emitting region 60, an electron blocking layer 70, and a second conductivity type semiconductor layer 80.

The base 10 may be a printed circuit board, a sapphire substrate, a silicon substrate, a GaN substrate, polyimide, an epoxy molding compound (EMC), or the like. The base 10 may be disposed on a path through which light emitted from the light emitting region 60 passes or transmits. Light may pass through the base 10 and be emitted to the outside of the light emitting device.

The base 10 may have a concavo-convex shape on its surface, and light may be scattered using the concavo-convex shape. When the light emitting region 60 emits light having a plurality of peak wavelengths, light having different peak wavelengths may be mixed in the base 10. That is, the base 10 may serve as a mixing zone of light.

The buffer layer 20 is a low-temperature buffer layer for growing a gallium nitride-based semiconductor layer on a heterogeneous substrate, for example, a nucleation layer, and may be formed of, for example, at least one of AlGaN layer, GaN layer or AlN layer. A high-temperature buffer layer, for example, an undoped GaN layer, may be additionally formed on the buffer layer 20.

The first conductivity type semiconductor layer 40 may serve as a contact layer for supplying electricity to the light emitting device. The first conductivity type semiconductor layer 40 may include a III-V material such as $Al_{(x)}In_{(y)}Ga_{(1-x-y)}N$ (x, y>=0) or GaAs or GaInP, and may be doped with a dopant such as Si. The buffer layer 20 and the first conductivity type semiconductor layer 40 may constitute a first conductivity type semiconductor region 45.

The light emitting region 60 may be formed on the first conductivity type semiconductor layer 40. The light emitting region 60 may include a III-V material such as $Al_{(x)}In_{(y)}Ga_{(1-x-y)}N$ (x, y>=0) or GaAs or GaInP. The light emitting region 60 may include a light emitting portion emitting blue light, green light, or red light, and may have a structure in which a plurality of light emitting portions emitting different peak wavelengths is vertically stacked. The plurality of light emitting portions may include a first light emitting portion and a second light emitting portion. Each of the light emitting portions may have a different type of materials that determine a peak wavelength or CIE or CRI of emitted light, or may have a different composition of materials. For example, the first light emitting portion and the second light emitting portion may emit different peak wavelengths from each other, and a composition of the material forming the first light emitting portion may be configured to emit light having a wavelength longer than a composition of the material forming the second light emitting portion. For instance, the second light emitting portion may emit blue light, and the first light emitting portion may emit green, yellow, or red light.

In an embodiment, the first light emitting portion emitting light having a relatively longer peak wavelength may be disposed closer to a first conductivity type semiconductor layer 40 than the second light emitting portion, and the second light emitting portion emitting light having a relatively shorter peak wavelength may be disposed closer to a second conductivity type semiconductor layer 80 than the first light emitting portion. However, the inventive concepts are not limited thereto, and positions of the first light emitting portion and the second light emitting portion may be changed according to a device structure. For example, the second light emitting portion emitting light having the relatively shorter peak wavelength may be disposed closer to the first conductivity type semiconductor layer 40 than the first light emitting portion, and the first light emitting portion emitting light having the relatively longer peak wavelength may be disposed closer to the second conductivity type semiconductor layer 80 than the second light emitting portion.

The electron blocking layer 70 may be formed on the light emitting region 60. The electron blocking layer 70 serves as a resistor in a flow of current, and may function as a barrier to prevent electrons injected from the first conductivity type semiconductor layer 40 from flowing into the second conductivity type semiconductor layer 80. The electron blocking layer 70 may include a III-V material such as $Al_{(x)}In_{(y)}Ga_{(1-x-y)}N$ (x, y>=0) or GaAs or GaInP, and may have an energy band gap wider than those of the first and second conductivity type semiconductor layers 40 and 80. For example, the energy band gap of at least one layer of the electron blocking layer 70 may be wider than the energy band gap of at least one layer of the first and second conductivity type semiconductor layers 40 and 80 by 0.9 eV or more. The electron blocking layer 70 may be formed of a single layer or a plurality of layers. When formed of the plurality of layers, the electron blocking layer 70 may include a plurality of layers having different Al contents or band gap energies, and in this case, a layer having a relatively high Al content or a layer having a relatively wide band gap energy may be disposed closer to the light emitting region 60. A difference in Al contents between the layer with a relatively high Al content and a layer with a relatively low Al content may be within 10%, or a difference in band gap energies may be within 0.6 eV. In another embodiment, a profile of the Al content of the resistor portion 70 may be substantially similar to a profile of an In content of the resistor portion 70. That is, the In content may be relatively high where the Al content is relatively high, and the In content may be relatively low where the Al content is relatively low. However, the inventive concepts are not necessarily limited thereto, and the profile of the Al content and the profile of the In content may be different.

Figure 2:
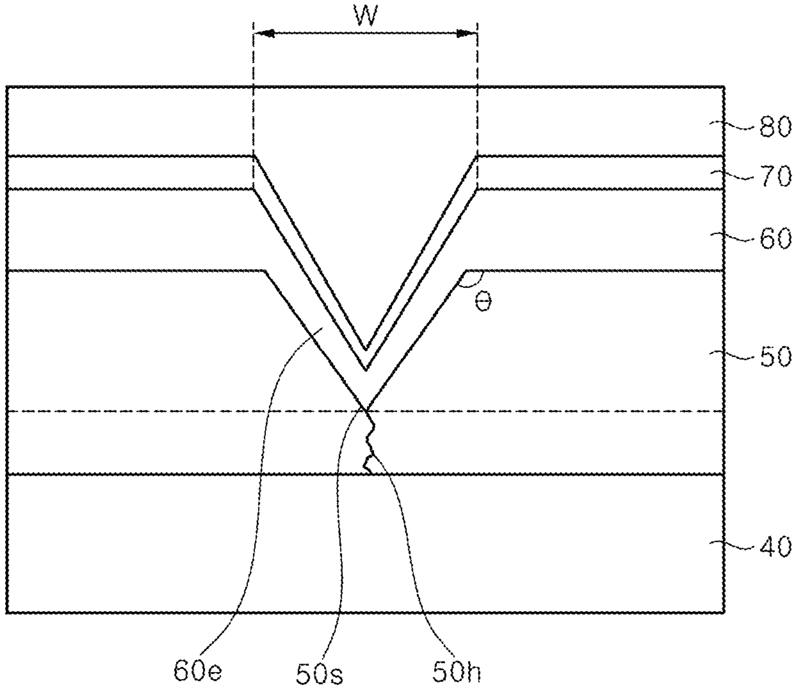
FIG. 2 is an enlarged cross-sectional view of a portion of FIG. 1.

The control portion 50 (control structure) may be formed between the first conductivity type semiconductor layer 40 and the light emitting region 60. As shown in FIG. 2, the control portion 50 may include a holding portion **50*h* generating a holding spot 50*s*. The control portion 50 may include a material such as InGaN, GaN, InGaAs, GaAs, or the like and a portion of the light emitting region 60 may extend toward the holding spot 50*s* by the holding spot 50*s* formed on the holding portion 50*h* to form an extension portion 60*e*. A height of the holding portion 50*h* may be about 1000 Å to about 2500 Å. A plurality of holding portions 50*h* may be formed in the control portion 50, and the plurality of holding portions 50*h*** may be laterally spaced apart.

The second conductivity type semiconductor layer 80 may be formed on the electron blocking layer 70. The second conductivity type semiconductor layer 80 may have a polarity opposite to that of the first conductivity type semiconductor layer 40, and may include, for example, a material such as Mg, B, or the like. The electron blocking layer 70 and the second conductivity type semiconductor layer 80 may constitute a second conductivity type semiconductor region 85. The material such as Mg, B, or the like of the second conductivity type semiconductor layer 80 may have an inclined profile, and may have a left-right asymmetrical profile with respect to a peak point having a highest content of the material. Preferably, a slope of a profile in a direction closer to the light emitting region 60 with respect to the peak point may be relatively gentler than a slope of a profile disposed opposite to the peak point.

Figure 3:
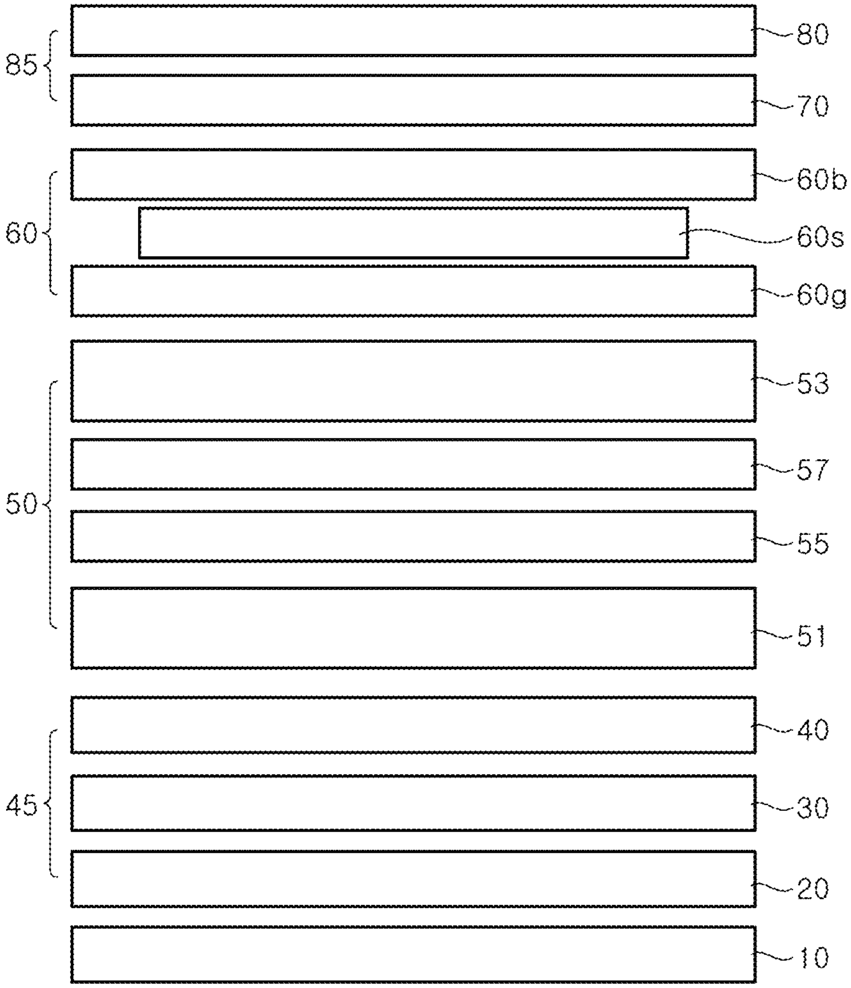
FIG. 3 is a schematic cross-sectional view illustrating a light emitting device according to an exemplary embodiment of the present disclosure.
Figure 4A:
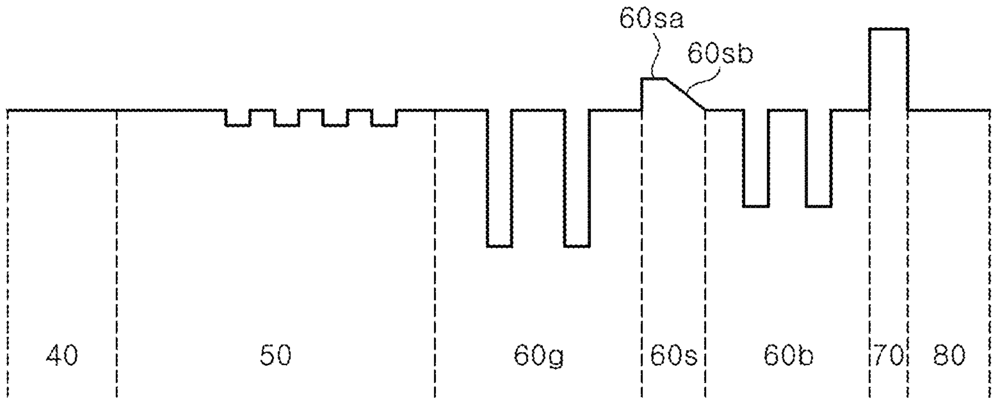
FIG. 4A is a band diagram illustrating a light emitting device according to an exemplary embodiment of the present disclosure.
Figure 4B:
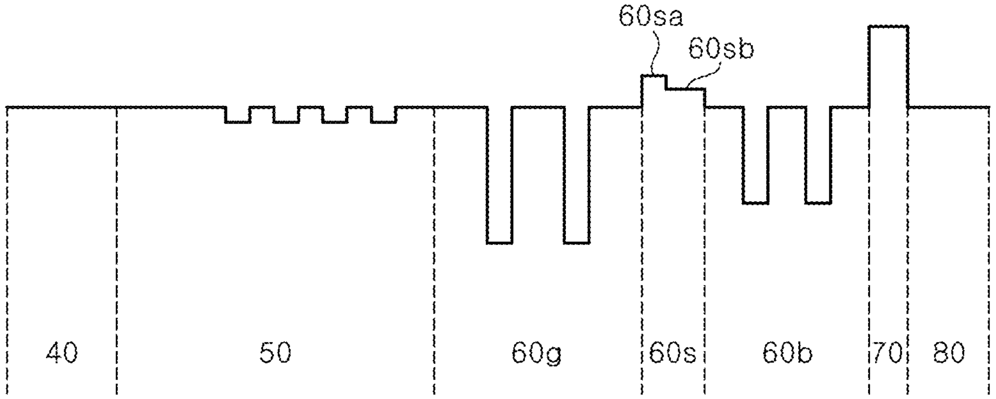
FIG. 4B is a band diagram illustrating a light emitting device according to another exemplary embodiment of the present disclosure.

Hereinafter, specific examples of the light emitting device will be described in more detail with reference to FIGS. 3, 4A, and 4B. FIG. 3 is a schematic cross-sectional view illustrating a light emitting device according to an embodiment of the present disclosure, FIG. 4A is a schematic band diagram illustrating a light emitting device according to an embodiment of the present disclosure, and FIG. 4B is a schematic band diagram illustrating a light emitting device according to another exemplary embodiment of the present disclosure.

Referring to FIG. 3, the light emitting device according to this embodiment, as described with reference to FIG. 1, may include a base 10, a first conductivity type semiconductor region 45, a control portion 50, a light emitting region 60, and a second conductivity type semiconductor region 85.

Since the base 10 has been described with reference to FIG. 1, a detailed description thereof will be omitted to avoid redundancy. The first conductivity type semiconductor region 45 may include a buffer layer 20, an undoped GaN layer 30, and a first conductivity type semiconductor layer 40. The first conductivity type semiconductor region 45 of this embodiment is same as the first conductivity type semiconductor region 45 described with reference to FIG. 1, except that the undoped GaN layer 30 is clearly shown in the drawing, and a detailed description thereof is omitted.

The control portion 50 may be formed of a plurality of layers. As shown in FIG. 3, the control portion 50 may include a first V-pit generation layer (VGL, 51), a first intermediate layer 55, a second intermediate layer 57, and a second VGL 53. Each of the layers of the control portion 50 may be formed of $Al_{(x)}In_{(y)}Ga_{(1-x-y)}N$ (x, y>=0) or GaAs or GaInP, and each of the first and second intermediate layers may include layers having different band gap energies from each other.

As shown in FIG. 3, among the layers of the control portion 50, the first VGL 51 may be disposed closest to the first conductivity type semiconductor layer 40, and the second VGL 53 may be closest to the second conductivity type semiconductor layer 80. The first intermediate layer 55 and the second intermediate layer 57 may be disposed between the first VGL 51 and the second VGL 53. Additional layers may be further included between these layers, but the inventive concepts are not necessarily limited thereto.

The first VGL 51 may be grown at a temperature lower than a growth temperature of the first conductivity type semiconductor layer 40, for example, 900° C. or less, and may include a GaN layer. The first VGL 51 may be formed using a TMGa source to increase a growth rate, and sizes and densities of the holding portion **50*h*, the holding spot 50*s*, or the extension portion 60*e* may be adjusted. For example, sizes and densities of V-pits may be adjusted. The first VGL 51 may be formed to have a thickness within a range of about 1000 Å to about 2500 Å. The first VGL 51 may be thicker than the second VGL 53, and a thickness difference may be preferable within 30%. A sum of the thicknesses of the first VGL 51 and the second VGL 53 may be greater than a sum of thicknesses of the light emitting region 60. Alternatively, the sum of the thicknesses of the first VGL 51 and the second VGL 53 may be greater than a sum of thicknesses of the electron blocking layer 70 and the second conductivity type semiconductor layer 80. Alternatively, the sum of the thicknesses of the first VGL 51 and the second VGL 53 may be greater than a thickness from an interface between the second VGL 51 and an adjacent layer in a direction of the light emitting region 60 to an interface where the second conductivity type semiconductor layer 80 is electrically connected to a conductive electrode. In this case, the difference in thicknesses may be 1.5 times or more. A doping concentration of the first conductivity type semiconductor layer 40 may be 7 times greater than that of at least one of the first VGL 51 and the second VGL 53**.

The first intermediate layer 55 or the second intermediate layer 57 is a layer added to substantially control strain, and may be formed of AlN, $Al_{(x)}Ga_{(1-x-y)}N$(x, y>=0), or GaN. Each of the first and second intermediate layers 55 and 57 may have a thickness of about 10 Å to about 150 Å. The first and second intermediate layers 55 and 57 may have different thicknesses from each other. The first intermediate layer 55 or the second intermediate layer 57 may include an n-type dopant. A doping concentration of the first intermediate layer 55 or the second intermediate layer 57 may be lower than that of the first conductivity type semiconductor layer 40, and higher than that of the second VGL 53.

The second VGL 53 may be a single layer or a plurality of layers, and may have a superlattice structure, but the inventive concepts are not necessarily limited thereto. The second VGL 53 may be formed of InGaN/GaN or GaN or InGaN, and for example, it may be InGaN/GaN containing In to have an energy band gap corresponding to an energy of a wavelength of 405 nm or less. In this case, the second VGL 53 may grow relatively slowly along a V-pit structure formed in the first VGL 51 by using a TEGa source as a Ga source. The second VGL 53 may be grown at a temperature lower than the growth temperature of the first conductivity type semiconductor layer 40, for example, 900 °C or lower. The second VGL 53 may be formed to have a thickness of about 1000 Å to about 2500 Å, and may be doped with impurities. For example, a doping concentration of silicon doped into the second VGL 53 may be 1E17 to 5E18/cm$^3$.

The light emitting region 60 may include a plurality of light emitting portions 60*b* and 60*g*. For example, a first light emitting portion 60*g* may emit green or yellow light, and a second light emitting portion 60*b* may emit blue light. The first and second light emitting portions 60*g* and 60*b* may have a single or multiple quantum well structure, and may include an InGaN, InAlGaN, GaInP, or GaInAlP well layer.

A V-shaped extension (60*e* in FIG. 1) is formed by the control portion 50, and thus, strain relief of the light emitting region 60 occurs. Accordingly, a greater amount of In may flow into the light emitting region 60, and thus, a radiation efficiency of the plurality of light emitting regions may be improved in a single LED structure, and white light may be implemented without a phosphor.

The light emitting portion 60 may include the first light emitting portion 60*g*, a separation layer 60*s*, and the second light emitting portion 60*b*. The first light emitting portion 60*g* may emit light having a wavelength longer than that of the second light emitting portion 60*b*, and may be disposed closer to the first conductivity type semiconductor layer 40. Accordingly, light generated in the first light emitting portion 60*g* may pass through the second light emitting portion 60*b* and the second conductivity type semiconductor layer region 85 without being lost by the second light emitting portion 60*b* to be emitted to the outside. The first light emitting portion 60*g* may have a refractive index higher than that of the second light emitting portion 60*b*. Light emission efficiency may be increased by arranging the first light emitting portion 60*g* and the second light emitting portion 60*b* in an order in which the refractive index decreases toward the outside. For example, the first light emitting portion 60*g*, the second light emitting portion 60*b*, and air may be arranged such that a refractive index decreases in this order. Alternatively, the first light emitting portion 60*g*, the second light emitting portion 60*b*, and a molding material may be arranged such that the refractive index decreases in this order. With respect to a path of light until it is emitted to the outside, a path of light generated from the first light emitting portion 60*g* may be longer than a path of light generated from the second light emitting portion 60*b*. That is, for any one external point, a vertical path of light having a smaller band gap energy may be longer than a vertical path of light having a larger band gap energy. In this embodiment, the light emitting device may be manufactured as a lateral type light emitting device, for example.

The first light emitting portion 60*g* may emit, for example, green light, yellow light, or red light, and the second light emitting portion 60*b* may emit blue light. For example, blue light may have a peak wavelength within a range of 425 nm to 465 nm, and green light, yellow light, and red light may have peak wavelengths within a range of 525 nm to 550 nm, 550 nm to 600 nm, and 610 nm to 650 nm, respectively.

The separation layer 60*s* is disposed between the light emitting portions 60*g* and 60*b* having different band gaps and emitting light of different peak wavelengths, to adjusts carrier dynamics such that electrons and holes perform optimal emission recombination in each of the light emitting portions 60*g* and 60*b*. In this embodiment, the separation layer 60*s* separates the first light emitting portion 60*g* and the second light emitting portion 60*b*.

The separation layer 60*s* may have a band gap equal to or greater than a maximum band gap of the first light emitting portion 60*g* and the second light emitting portion 60*b*. The separation layer 60*s* may be formed of an undoped layer. That is, when growing the separation layer 60*s*, no intentional doping is performed.

The separation layer 60*s* may be formed of Al(In)GaN, and may be formed to have a thickness within a range of about 5 nm to 80 nm, specifically 15 nm to 50 nm. The separation layer 60*s* includes Al, and an amount of Al in the separation layer 60*s* may be in a range of about 0.1 atomic % to about 50 atomic %.

The separation layer 60*s* may be a single layer or a multi-layer of $Al_{(x)}In_{(y)}Ga_{(1-x-y)}N$ (x, y>=0), or may have a structure of a superlattice layer of $Al_{(x)}In_{(y)}Ga_{(1-x-y)}N$/(x, y>=0)/$Al_{(a)}In_{(b)}Ga_{(1-a-b)}N$/(a, b>=0). When the separation layer 60*s* has a multi-layer structure, a layer close to the first conductivity type semiconductor layer 40 may contain more Al.

FIGS. 4A and 4B show examples in which the separation layer 60*s* is formed of a plurality of layers. For example, the separation layer 60*s* may include a constant composition layer and an inclination composition layer as shown in FIG. 4A, and may include constant composition layers having different compositions from each other as shown in FIG. 4B. A gradient of the constant composition layer may be different from that of the inclination composition layer. For example, the gradient of the inclination composition layer may be greater than that of the constant composition layer. Within the separation layer 60*s*, a layer having a relatively wide energy band gap may be disposed closer to the first conductivity type semiconductor layer 40, and thus, a movement of electrons may be relatively more limited considering mobilities of electrons and holes, The separation layer 60*s* may include, for example, a first layer 60*sa* and a second layer 60*sb*, and may include an AlN layer as the first layer 60*sa* and an AlGaN layer as the second layer 60*sb*. The first layer 60*sa* may be disposed closer to the first conductivity type semiconductor layer 40 than the second layer 60*sb*. Alternatively, in the separation layer 60*s*, the first layer 60*sa* may be disposed closer to the first light emitting portion 60*g* than the second layer 60*sb*.

A thickness of the first layer 60*sa* may be within a range of about 1 nm to 3 nm, and a composition of Al may be 50 atomic % or less. A maximum Al composition of the second layer 60*sb* adjacent to the first layer 60*sa* may be within a range of 10 atomic % to 30 atomic %. The second layer 60*sb* may be an inclination composition layer as shown in FIG. 4A, or a constant composition layer as shown in FIG. 4B. In the inclination composition layer, an Al composition decreases from a first conductivity type semiconductor layer 40 side to a second conductivity type semiconductor layer side 80, and accordingly, the band gap energies gradually decrease. The second layer 60*sb* may be formed to have a thickness within a range of about 10 nm to 50 nm, and furthermore, may be formed to have a thickness within a range of about 10 nm to 20 nm.

The thickness of the separation layer 60*s*, the composition ratio of Al, and an Al composition profile may vary depending on a driving current density of the light emitting device. For example, when a current density is 35 A/cm$^2$ or less, the separation layer 60*s* may have a thickness equal to or smaller than that of the electronic blocking layer 70, and may have a composition ratio equal to or smaller than an average Al composition ratio of the electronic blocking layer 70. Alternatively, when the current density exceeds 35 A/cm$^2$, the separation layer 60*s* may have a thickness equal to or greater than that of the electronic blocking layer 70, and may have a composition ratio equal to or greater than the average Al composition ratio of the electronic blocking layer 70.

The separation layer 60*s* is grown between the first light emitting portion 60*g* and the second light emitting portion 60*b*, and may be grown at a temperature between about 800° C. and about 950° C.

In this embodiment, a structure of the light emitting device suitable for the lateral type light emitting device has been described, but the inventive concepts are not limited to the lateral type light emitting device, and may be manufactured as a vertical or flip chip type light emitting device. In this case, positions of the first light emitting portion 60*g* and the second light emitting portion 60*b* may be interchanged. This will be described again with reference to FIG. 5.

Figure 5:
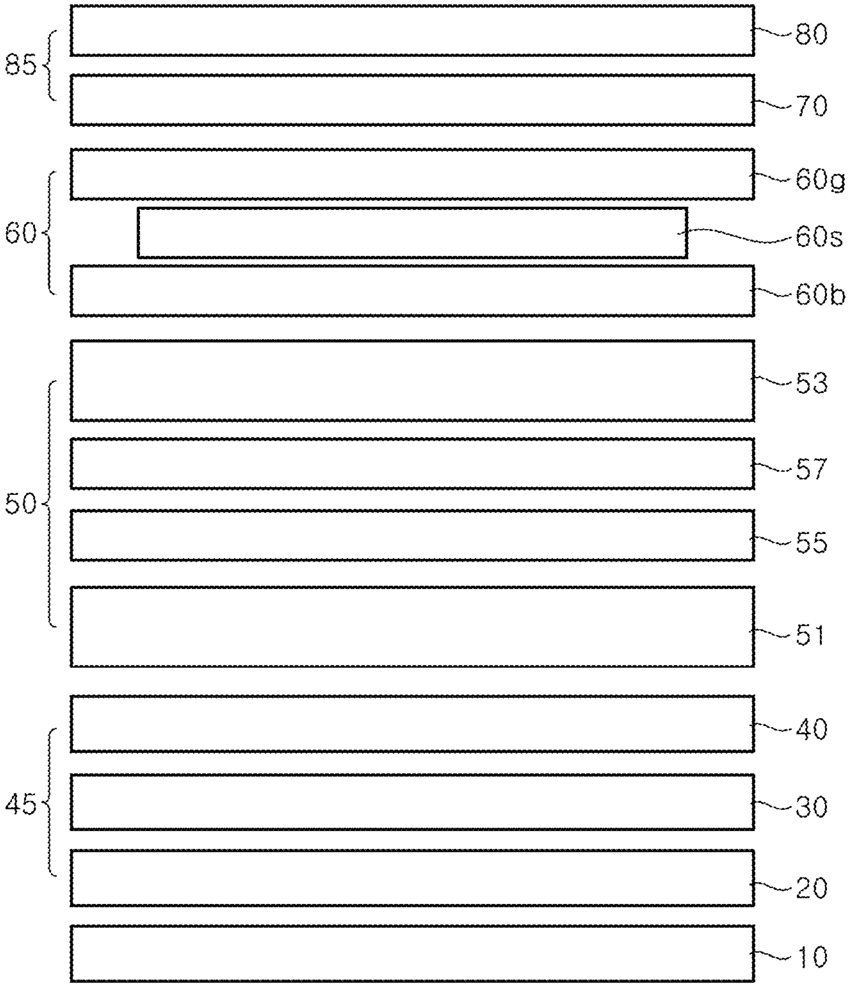
FIG. 5 is a schematic cross-sectional view illustrating a light emitting device according to an exemplary embodiment of the present disclosure.
Figure 6A:
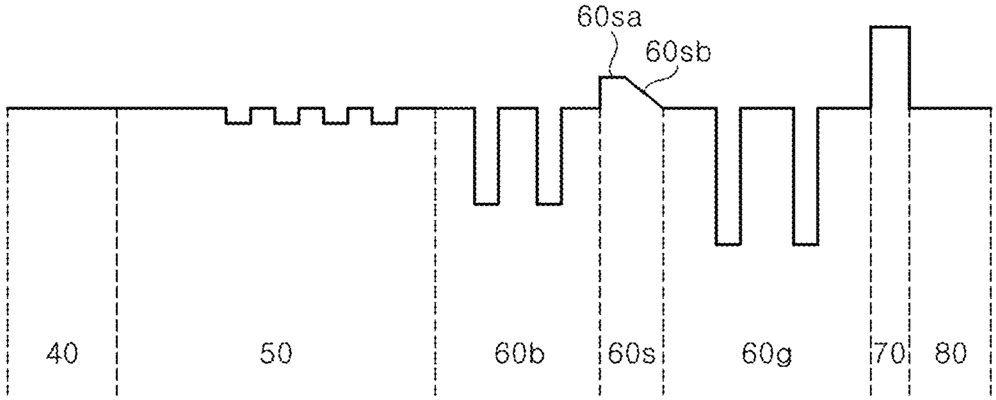
FIG. 6A is a band diagram illustrating a light emitting device according to an exemplary embodiment of the present disclosure.
Figure 6B:
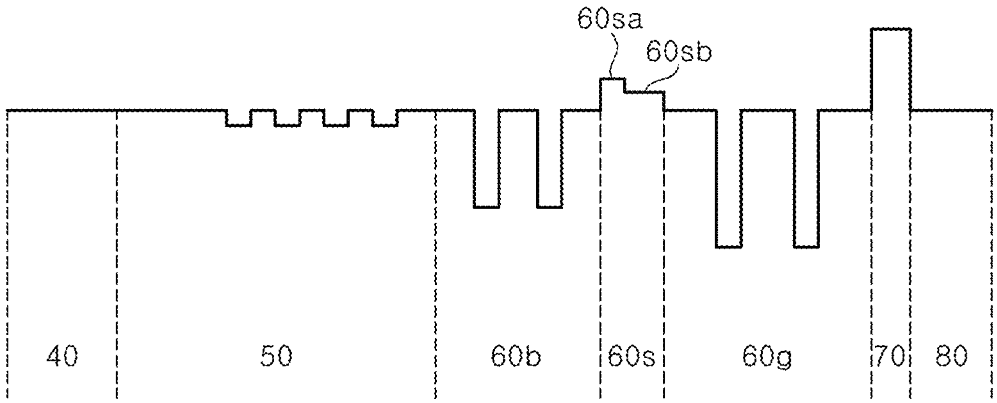
FIG. 6B is a band diagram illustrating a light emitting device according to another exemplary embodiment of the present disclosure.

FIG. 5 is a schematic cross-sectional view illustrating a light emitting device according to an embodiment of the present disclosure, FIG. 6A is a schematic band diagram illustrating a light emitting device according to an embodiment of the present disclosure, and FIG. 6B is a schematic band diagram illustrating a light emitting device according to another exemplary embodiment of the present disclosure.

Referring to FIG. 5, the light emitting device according to this embodiment is substantially similar to the light emitting device described with reference to FIG. 3, except that positions of a first light emitting portion 60*g* and a second light emitting portion 60*b* are changed. That is, the second light emitting portion 60*b* emitting light of a relatively shorter wavelength is disposed closer to the first conductivity type semiconductor layer 40 than the first light emitting portion 60*g* emitting light of a relatively longer wavelength. The light emitting device may be manufactured as a vertical or flip chip type light emitting device, and light generated in the first light emitting portion 60*g* and the second light emitting portion 60*b* passes through a first conductivity type semiconductor layer 40 to be emitted to the outside.

The first light emitting portion 60*g* may have a refractive index higher than that of the second light emitting portion 60*b*. Light emission efficiency may be increased by arranging the first light emitting portion 60*g* and the second light emitting portion 60*b* in an order in which the refractive index decreases toward the outside. For example, the first light emitting portion 60*g*, the second light emitting portion 60*b*, and air may be disposed in this order. Alternatively, the first light emitting portion 60*g*, the second light emitting portion 60*b*, and a molding material may be arranged in this order. Alternatively, the first light emitting portion 60*g*, the second light emitting portion 60*b*, and a base 10 may be arranged in this order.

With respect to a path of light until it is emitted to the outside, a path of light generated from the first light emitting portion 60*g* may be longer than a path of light generated from the second light emitting portion 60*b*. That is, for any one external point, a vertical path of light having a smaller band gap energy may be longer than a vertical path of light having a larger band gap energy. Alternatively, for a point on the substrate, a vertical path of light with a smaller band gap energy may be longer than a vertical path of light with a larger band gap energy.

A separation layer 60*s* is disposed between the first light emitting portion 60*g* and the second light emitting portion 60*b*. The separation layer 60*s* is similar to that described with reference to FIGS. 3, 4A and 4B, but a first layer 60*sa* may be disposed closer to the second light emitting portion 60*b* than a second layer 60*sb* in the separation layer 60*s*.

Figure 7:
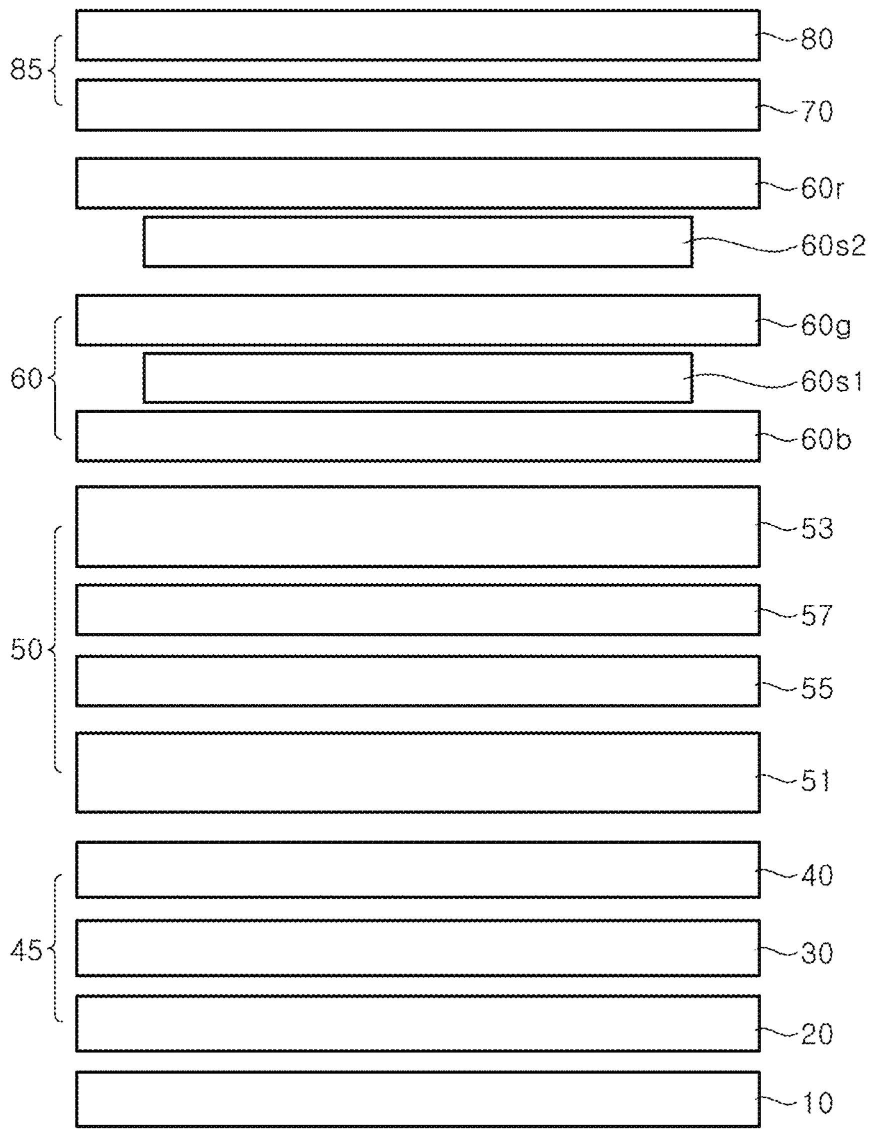
FIG. 7 is a schematic cross-sectional view illustrating a light emitting device according to an exemplary embodiment of the present disclosure.
Figure 8A:
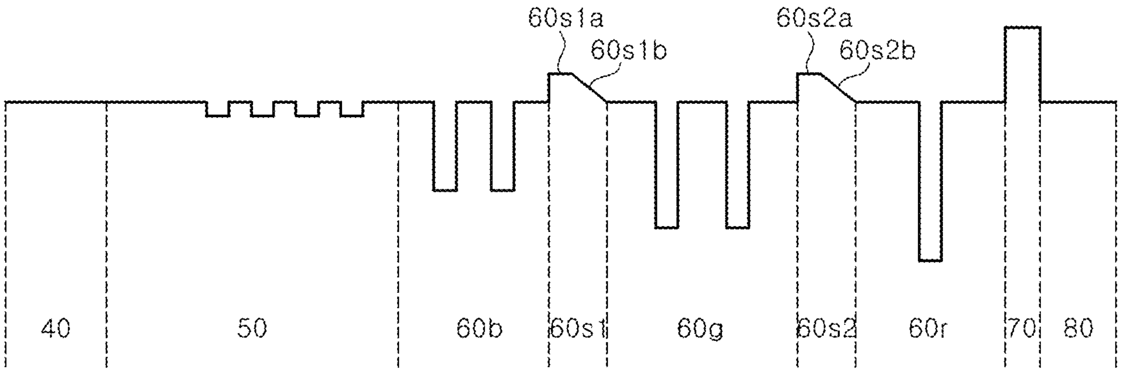
FIG. 8A is a schematic band diagram illustrating a light emitting device according to an exemplary embodiment of the present disclosure.
Figure 8B:
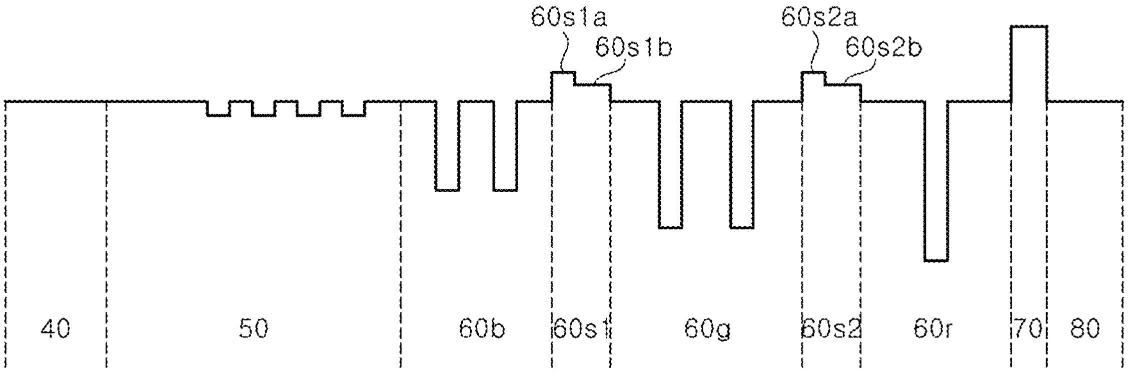
FIG. 8B is a schematic band diagram illustrating a light emitting device according to another exemplary embodiment of the present disclosure.

FIG. 7 is a schematic cross-sectional view illustrating a light emitting device according to an embodiment of the present disclosure, FIG. 8A is a schematic band diagram illustrating a light emitting device according to an embodiment of the present disclosure, and FIG. 8B is a schematic band diagram illustrating a light emitting device according to another embodiment.

Referring to FIG. 7, the light emitting device according to this embodiment is similar to the light emitting device described with reference to FIG. 5, except that it further includes a third light emitting portion 60*r* and further includes a second separation layer 60*s*2 together with a first separation layer 60*s*1.

For example, a first light emitting portion 60*g* may be configured to emit green light or yellow light, a second light emitting portion 60*b* may be configured to emit blue light, and the third light emitting portion 60*r* may be configured to emit red light. White light may be implemented by mixing lights emitted from the first through third light emitting portions 60*g*, 60*b*, and 60*r*.

The first separation layer 60*s*1 may be disposed between the first light emitting portion 60*g* and the second light emitting portion 60*b*, and the second separation layer 60*s*2 may be disposed between the first light emitting portion 60*g* and the third light emitting portion 60*r*. Specific configurations of the first and second separation layers 60*s*1 and 60*s*2 are similar to those described with reference to FIGS. 3, 4A, and 4B, but a band gap energy of each of the first and second separation layers 60*s*1 and 60*s*2 may be different from each other. When each of the first and second separation layers 60*s*1 and 60*s*2 includes a plurality of layers, the first and second separation layers 60*s*1 and 60*s*2 may be compared with an average value of a maximum energy band gap and a minimum energy band gap of the plurality of layers constituting each of the first and second separation layers 60*s*1 and 60*s*2, and average energy band gaps of the first and second separation layers 60*s*1 and 60*s*2 may be different from each other. Alternatively, respective inclinations of the first and second separation layers 60*s*1 and 60*s*2 may be different from each other. Accordingly, there is an effect of dispersing a strain formed inside the semiconductor layer.

Referring to FIGS. 8A and 8B, the first separation layer 60*s*1 may include a first-1 layer 60*s*1*a* and a first-2 layer 60*s*1*b*, and the second separation layer 60*s*2 may include a second-1 layer 60*s*2*a* and a second-2 layer 60*s*2*b*.

Respective inclinations of the first-1 layer 60*s*1*a* and the first-2 layer 60*s*1*b* may be different from each other, and a band gap energy of the first-1 layer 60*s*1*a* may be bigger than a band gap energy of the first-2 layer 60*s*1*b*. In addition, the first-1 layer 60*s*1*a* may be disposed closer to a first conductivity type semiconductor layer 40 than the first-2 layer 60*s*1*b*. Inclinations of the second-1 layer 60*s*2*a* and the second-2 layer 60*s*2*b* may be different from each other. In addition, the second-1 layer 60*s*2*a* may be disposed closer to the first conductivity type semiconductor layer 40 than the second-2 layer 60*s*2*b*.

The band gap energy of the first-1 layer 60*s*1*a* may be different from that of the second-1 layer 60*s*2*a*, and the band gap energy of the first-1 layer 60*s*1*a* may be greater than that of the second-1 layer 60*s*2*a*. The band gap energy of the first-2 layer 60*s*1*b* may be different from that of the second-2 layer 60$s$2$b$, and the band gap energy of the first-2 layer 60$s$1$b$ may be greater than that of the second-2 layer 60$s$2$b$.

Figure 9:
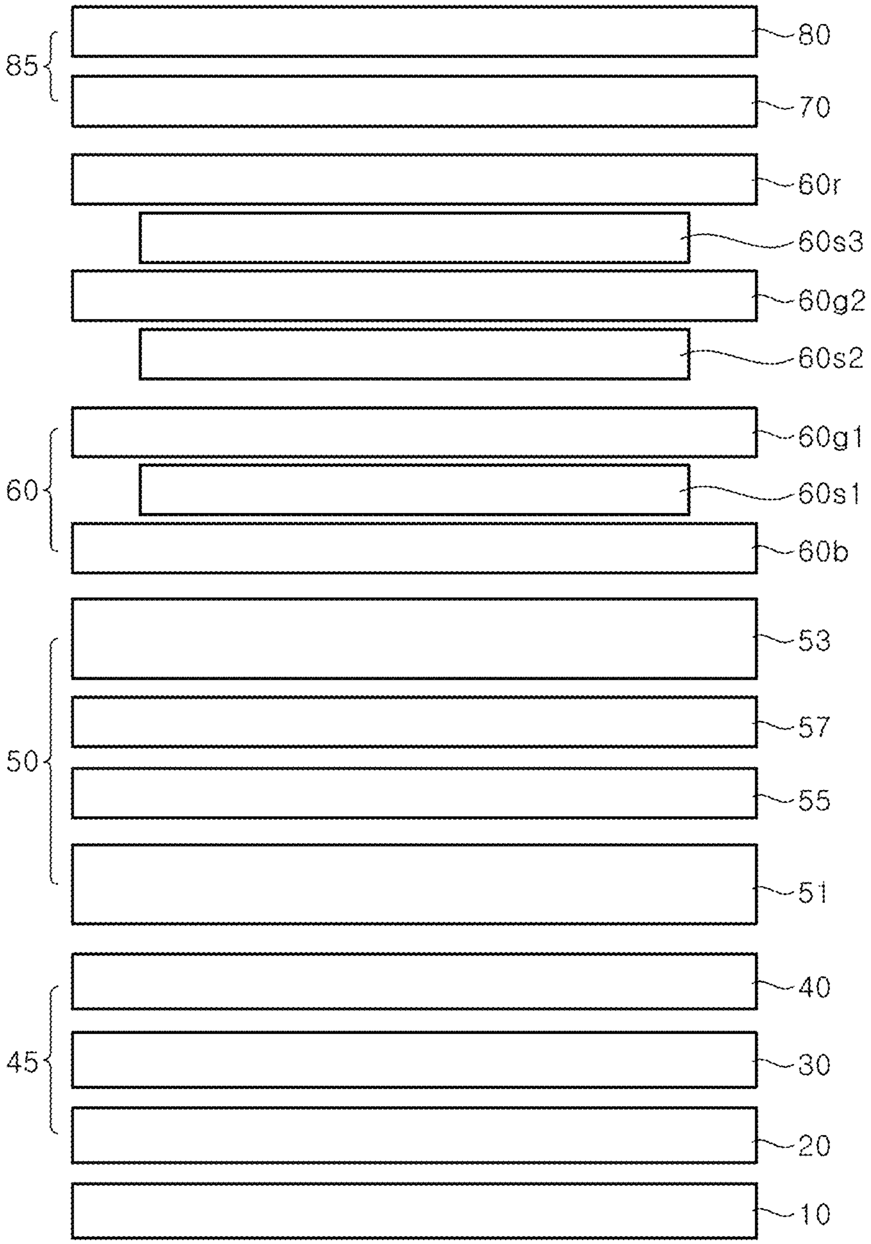
FIG. 9 is a schematic cross-sectional view illustrating a light emitting device according to an exemplary embodiment of the present disclosure.

FIG. 9 is a schematic cross-sectional view illustrating a light emitting device according to an exemplary embodiment of the present disclosure.

Referring to FIG. 9, the light emitting device according to this embodiment is substantially similar to the light emitting device described with reference to FIG. 7, except that four light emitting portions 60$b$, 60$g$1, 60$g$2, and 60$r$ are separated from one another by three separation layers 60$s$1, 60$s$2, and 60$s$3.

For example, two light emitting portions 60$g$1 and 60$g$2 emitting green or yellow light may be disposed between the light emitting portion 60$b$ emitting blue light and the light emitting portion 60$r$ emitting red light, and these light emitting portions 60$b$, 60$g$1, 60$g$2, and 60$r$ may be separated from one another by the separation layers 60$s$1, 60$s$2, and 60$s$3.

The light emitting portions 60$g$1 and 60$g$2 emitting green or yellow light may emit light having a same peak wavelength or different peak wavelengths.

In this embodiment, the light emitting portions 60$g$1 and 60$g$2 emitting green or yellow light are exemplarily described as being separated by the separation layer 60$s$2, but the light emitting portions emitting blue light may be disposed to be separated by a separation layer, or the light emitting portions emitting red light may be disposed to be separated by a separation layer.

In some embodiments, the separation layer 60$s$ may separate light emitting portions emitting light of different peak wavelengths. In other embodiments, the separation layer 60$s$ may separate light emitting portions emitting light of a same peak wavelength from each other.

Figure 10:
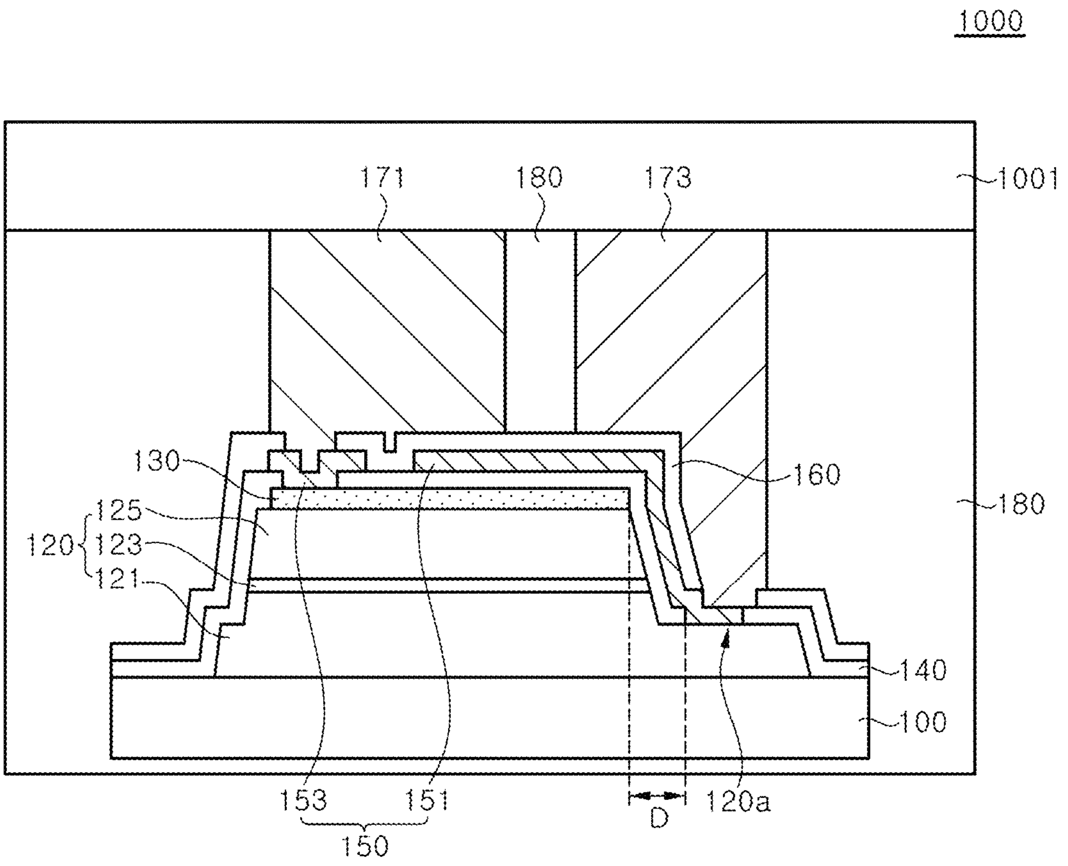
FIG. 10 is a schematic cross-sectional view illustrating a light emitting device according to another exemplary embodiment of the present disclosure.

FIG. 10 is a schematic cross-sectional view illustrating a light emitting apparatus 1000 according to an embodiment of the present disclosure.

Referring to FIG. 10, the light emitting apparatus 1000 according to this embodiment is flip-bonded to a circuit board 1001 by adding an electrode structure to the light emitting device described in the previous embodiments. Specifically, the light emitting apparatus 1000 may include a circuit board 1001, a base 100, a light emitting device 120, an ohmic electrode 130, a first insulation layer 140, and a pair of pad electrodes 150; 151 and 153, a second insulation layer 160, bump electrodes 171 and 173, and a filling layer 180.

Since the base 100 is same as the base 10 described above, a detailed description thereof will be omitted to avoid redundancy. In addition, the light emitting device 120 includes a first conductivity type semiconductor region 121, a light emitting region 123, and a second conductivity type semiconductor region 125 like the light emitting devices of the above-described embodiments, and although not shown in the drawing, it includes a control portion.

A portion of the first conductivity type semiconductor region 125 is exposed by etching the second conductivity type semiconductor region 125 and the light emitting region 123. An exposed surface of the first conductivity type semiconductor region 121 becomes a first conductivity type contact region 120$a$. Meanwhile, an upper surface of the second conductivity type semiconductor region 125 may become a second conductivity type semiconductor contact region. The ohmic electrode 130 may be disposed over the second conductivity type semiconductor region 125 to provide an ohmic contact.

The ohmic electrode 130 may be formed of a metallic material (Al, Ti, Ni, Ag, Au, W, Sn, or the like) or a transparent conductive oxide (ITO, ZnO, AZO, IZO, or the like). The first insulation layer 140 may cover the ohmic electrode 130. The first insulation layer 140 may cover a portion of the ohmic electrode 130 and may cover a side surface of a mesa and a portion of the first conductivity type contact region 120$a$ by a distance D. The first insulation layer 140 may include $SiO_2$, $SiN_x$, $TiO_2$, $Al_2O_3$ or the like, and may include a distributed Bragg reflector. The first insulation layer 140 may also cover a side surface of the first conductivity type semiconductor region 121 and an upper surface of the base 100.

The portion of the ohmic electrode 130 and the portion of the first conductivity type contact region 120$a$ may be exposed without being covered by the first insulation layer 140, and the pad electrodes 150; 151 and 153 formed on the first insulation layer 140 may be electrically connected to the exposed ohmic electrode 130 and the first conductivity type contact region 120$a$.

The bump electrodes 171 and 173 are formed over the pad electrodes 150; 151 and 153, and may include metallic material such as Al, Ti, Ni, Ag, Au, W, Sn, or the like. The bump electrodes 171 and 173 may be electrically connected to the pad electrodes 150; 151 and 153 to transfer electricity supplied from the circuit board to the light emitting device 120.

The second insulation layer 160 may be additionally formed between the bump electrodes 171 and 173 and the pad electrodes 150; 151 and 153. The second insulation layer 160 may include $SiO_2$, $SiN_x$, $TiO_2$, $Al_2O_3$, or a distributed Bragg reflector. Although the bump electrodes 171 and 173 are shown in FIG. 10 as being disposed in an upper portion, the light emitting device 120 may be flip-mounted and electrically connected to the circuit board 1001, and light may be emitted to the outside through the first conductivity type semiconductor region 121 and the base 100.

Meanwhile, the light emitting region may be formed of a nitride semiconductor, and may emit light having peak wavelengths equal to or greater than the number of the pad electrodes 151 and 153.

Figure 11:
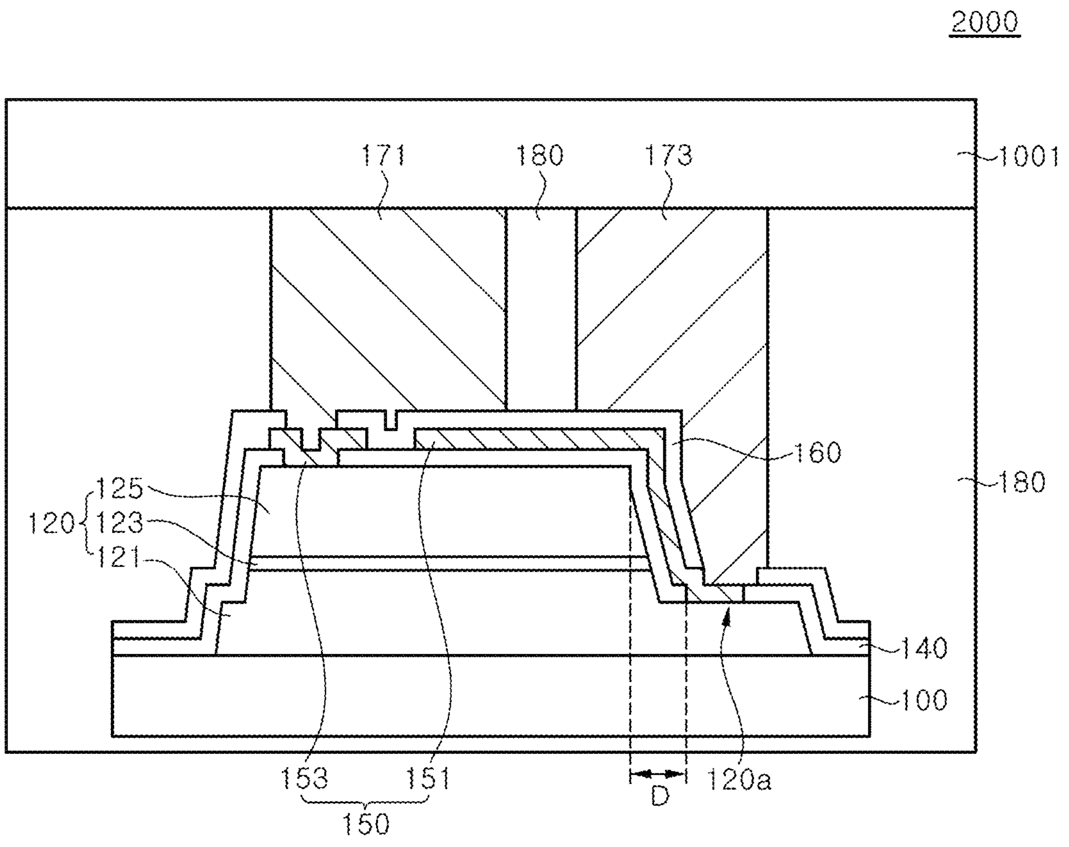
FIG. 11 is a schematic cross-sectional view illustrating a light emitting module according to an exemplary embodiment of the present disclosure.

FIG. 11 is a schematic cross-sectional view illustrating a light emitting apparatus 2000 according to another embodiment of the present disclosure.

Referring to FIG. 11, the light emitting apparatus 2000 according to this embodiment is substantially similar to the light emitting apparatus 1000 described with reference to FIG. 10, except that the ohmic electrode 130 is omitted.

That is, in the light emitting apparatus 2000 according to this embodiment, an electrode pad 153 formed over an insulation layer 140 without an additional ohmic electrode is in ohmic contact with a second conductivity type semiconductor region 125 to play a role as an ohmic electrode.

Figure 12:
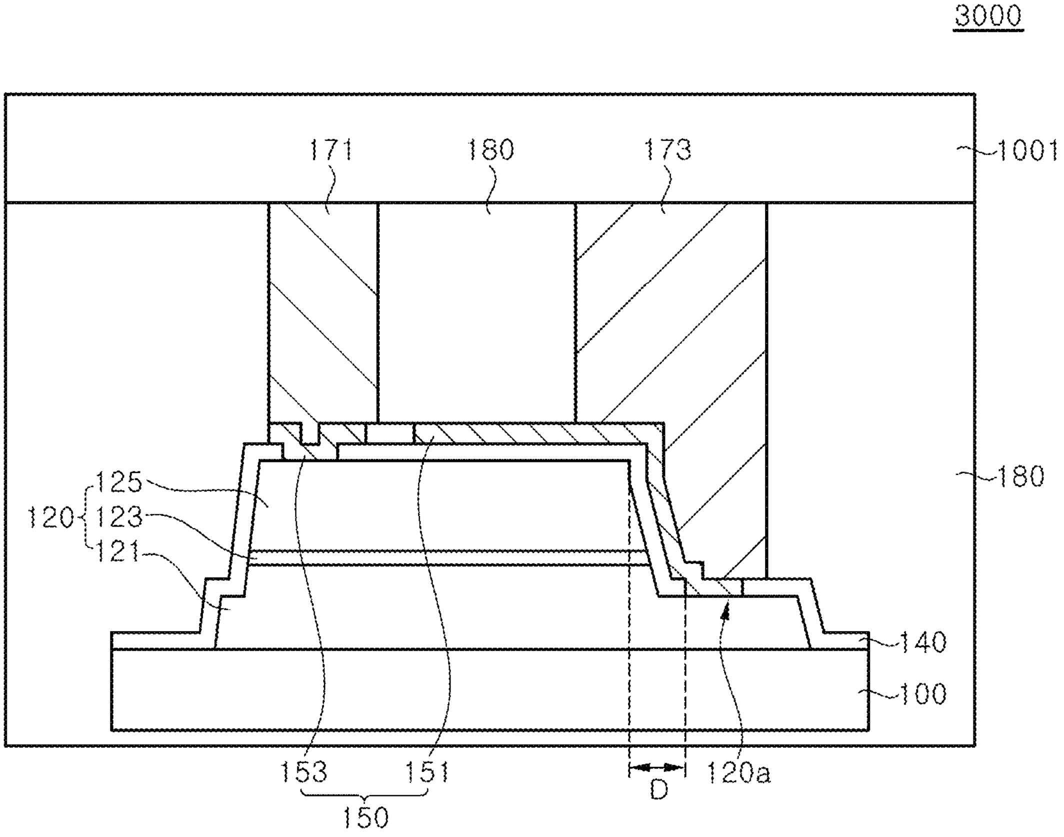
FIG. 12 is a schematic cross-sectional view illustrating a light emitting device according to another exemplary embodiment of the present disclosure.

FIG. 12 is a schematic cross-sectional view illustrating a light emitting apparatus 3000 according to another embodiment of the present disclosure.

Referring to FIG. 12, the light emitting apparatus 3000 according to this embodiment is substantially similar to the light emitting apparatus 2000 described with reference to FIG. 11, but except that the second insulation layer 160 is omitted. An insulation layer 140 and pad electrodes 150; 151 and 153 may be disposed between bump electrodes 171 and 173 and a light emitting device 120, and the bump electrodes 171 and 173 may be formed directly on the pad electrodes 150; 151 and 153. As described with reference to FIG. 10, the light emitting device 120 may be flip-mounted on the circuit board 1001 using the bump electrodes 171 and 173, and light may be emitted to the outside through a first conductivity type semiconductor region 121 and a base 100.

Figure 13A:
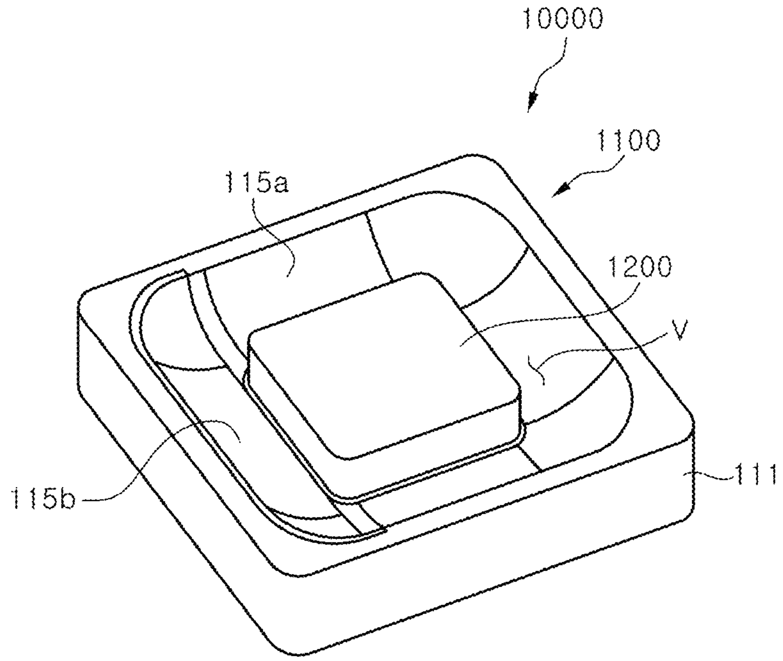
FIG. 13A is a perspective view illustrating a light emitting diode package to which a light emitting diode according to an exemplary embodiment of the present disclosure is applied.
Figure 13B:
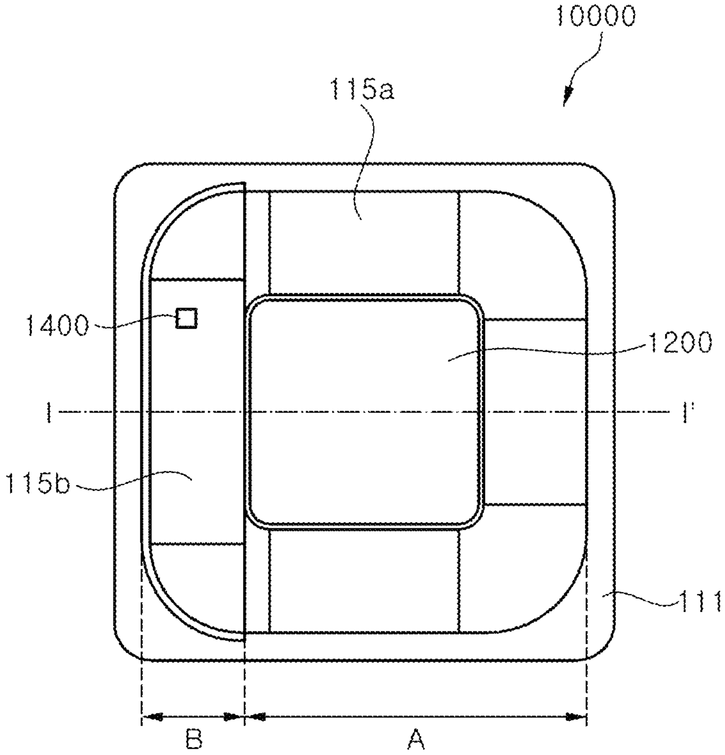
FIG. 13B is a plan view of FIG. 13A.
Figure 13C:
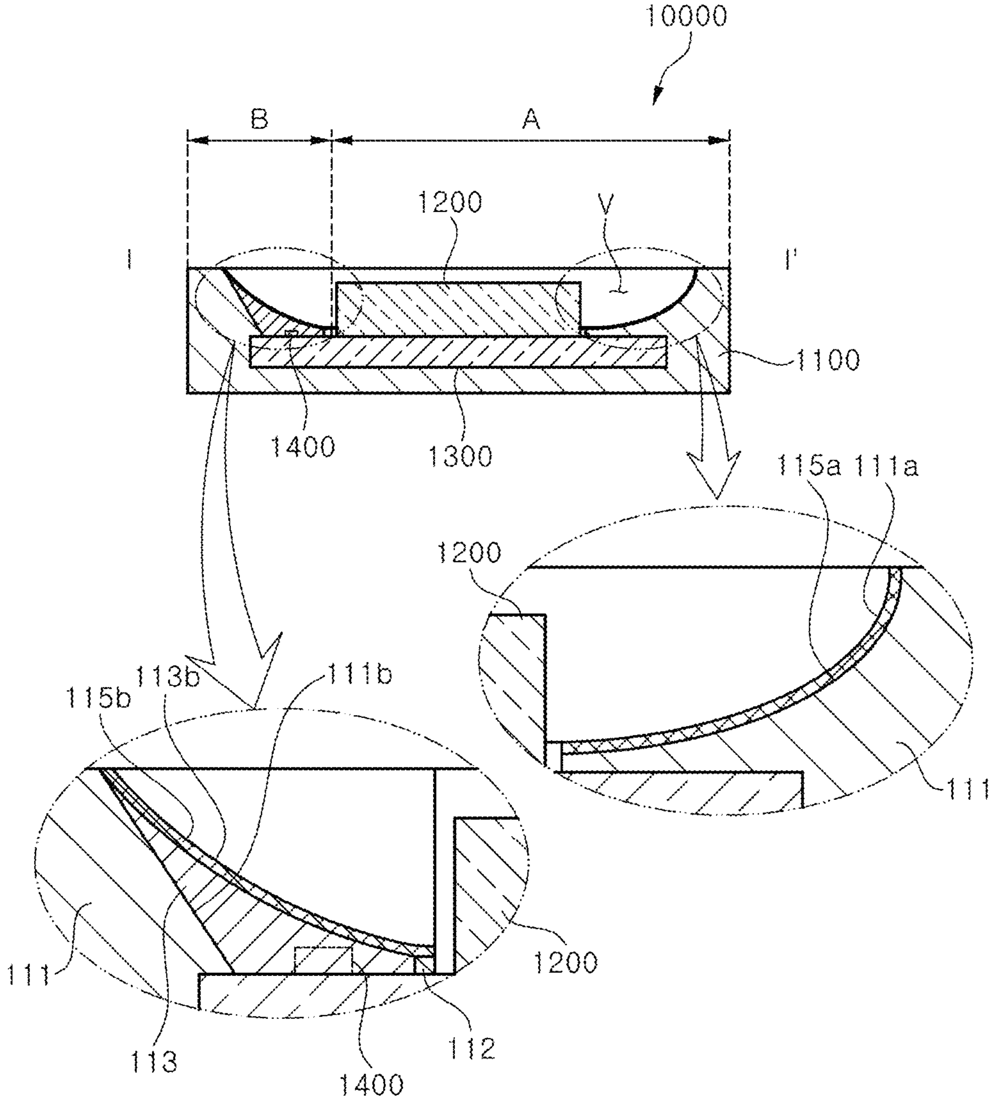
FIG. 13C is a cross-sectional view taken along line I-I' of FIG. 13B.

FIG. 13A is a perspective view illustrating a package to which a light emitting device according to an embodiment of the present disclosure is applied, FIG. 13B is a plan view of FIG. 13A, and FIG. 13C is a cross-sectional view taken along line I-I' of FIG. 13B.

Referring to FIGS. 13A, 13B, and 13C, a package 10000 includes a housing 1100, a light emitting device 1200, a lead frame 1300, and a Zener diode 1400.

The housing 1100 includes a body portion 111, a cover portion 113, and a coating portion 115 in this embodiment. As shown in the drawings, the body portion 111 may have a substantially rectangular shape in plan view, and may have a shape surrounding the lead frame 1300 to support the lead frame 1300. The housing 1100 may have a cavity V with one surface open therein, and the light emitting device 1200 may be disposed in the cavity V.

Herein, a depth of the cavity V may be greater than a height of the light emitting device 1200. In this case, as shown in FIGS. 13B and 13C, the body portion 111 may be divided into a region A and a region B. The region A may be a region where the light emitting device 1200 is mounted, and the region B may be a region where the Zener diode 140 is mounted.

Looking at the region A of the body portion 111, an inclined surface of the cavity V surrounding the light emitting device 1200 may have a same inclined surface with respect to the light emitting device 1200. In this case, a first body inclined surface 111*a* formed in the region A may be formed as a curved surface, as shown in FIG. 13C, and an inclination of the curved surface may become steeper toward an upper portion thereof.

The first body inclined surface 111*a* formed in the region A is formed on the cavities V of three surfaces of the light emitting device 1200 except for one surface of the light emitting device 1200. In this case, an inner side of the first body inclined surface 111*a* may be disposed adjacent to a position where a light emitting diode chip 120 is mounted. Accordingly, light emitted from the light emitting device 1200 may be reflected from the first body inclined surface 111*a* and emitted upward of the package 10000.

In this embodiment, a second body inclined surface 111*b* formed in the region B may be a linear cross-sectional shape. However, when the first body inclined surface 111*a* is formed as an inclined surface, the cross-sectional shape is not limited to being a linear cross-sectional shape, and may be formed as a curved cross-sectional shape.

In this case, as it can be seen in FIG. 13B, the region B may have a width in a vertical direction greater than a width in a vertical direction of the region A. Although this will be described later, this is to secure a space in which the cover portion 113 can be formed to cover the second body inclined surface 111*b*.

As shown in FIG. 13C, the cover portion 113 is disposed to cover the second body inclined surface 111*b* formed in the region B. The cover portion 113 is formed to have a thickness capable of covering the Zener diode 140 disposed in the region B, and is formed to a degree not to exceed a stepped portion 112. Also, as shown in the drawings, the cover portion 113 may have a cover inclined surface 113*b* formed as a gentle inclined surface. The cover inclined surface 113*b* may be formed as a curved surface, and may be formed such that a slope becomes gentle from an upper portion to a lower portion.

Herein, the cover portion 113 is described as being formed not to exceed the stepped portion 112, but is not limited thereto, and a portion of the cover portion 113 may be formed beyond the stepped portion 112 to a position where the light emitting diode chip 120 is mounted, if necessary. That is, the cover portion 113 may be formed to cover the second body inclined surface 111*b* and the Zener diode 1400 by using a viscous material including a reflective material. In this case, the reflective material may be TiO2 and Al2O3.

As the cover portion 113 is formed in the region B, the cover inclined surface 113*b* formed in the cavity V of the package 10000 may be formed in a shape similar to that of the first body inclined surface 111*a*. Accordingly, all surfaces of a reflection surface formed in the cavity V may be formed to be substantially same with respect to the light emitting device 1200.

The coating portion 115 is formed to cover the first body inclined surface 111*a* and the cover inclined surface 113*b* by using a coating material including a reflective material. In this case, the reflective material may be TiO2 and Al2O3. That is, the coating portion 115 may be formed to cover all regions in the cavity V of the package 10000 except for the light emitting device 1200. To this end, the coating portion 115 may be formed on the first body inclined surface 111*a* and the cover inclined surface 113*b* by using various methods such as spraying, dispensing, jetting, film attaching, sputtering, e-beam deposition, and the like, which may be performed above the cavity V of the package 10000, with an upper portion of the light emitting device 1200 masked. Accordingly, a first coating inclined surface 115*a* may be formed in the region A of the cavity V of the package 10000, and a second coating inclined surface 115*b* may be formed in the region B.

Figure 14:
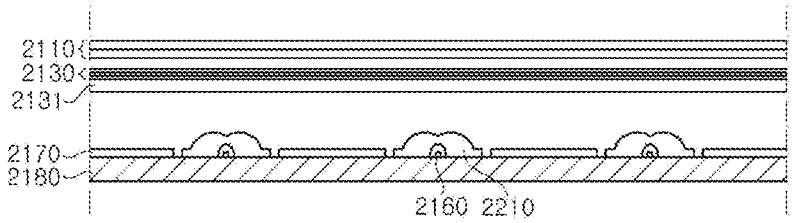
FIG. 14 is a cross-sectional view illustrating a display apparatus to which a light emitting device according to an exemplary embodiment of the present disclosure is applied.

FIG. 14 is a cross-sectional view illustrating a display apparatus to which a light emitting device according to an exemplary embodiment of the present disclosure is applied.

The display apparatus of this embodiment includes a display panel 2110, a backlight unit providing light to the display panel 2110, and a panel guide supporting a lower edge of the display panel 2110.

The display panel 2110 is not particularly limited, and may be, for example, a liquid crystal display panel including a liquid crystal layer. A gate driving PCB for supplying a driving signal to a gate line may be further disposed at the edge of the display panel 2110. Herein, the gate driving PCB may not be configured in an additional PCB, but may be formed on a thin film transistor substrate.

The backlight unit includes a light source module including at least one substrate and a plurality of light emitting devices 2160. Furthermore, the backlight unit may further include a base substrate 2180, a reflection unit 2170, a diffusion plate 213, and optical sheets 2130.

The base substrate 2180 may be opened upward and accommodate the substrate, the light emitting device 2160, the reflection sheet 2170, the diffusion plate 2131, and the optical sheets 2130. In addition, the base substrate 2180 may be coupled with the panel guide. The base substrate 2180 may be disposed under the reflection unit 2170, and the light emitting device 2160 may be disposed surrounded by the reflection unit 2170. However, without being limited thereto, the light emitting device 2160 may be disposed on the reflection unit 2170 when a reflective material is coated on a surface of the base substrate 2180. In addition, a plurality of substrates may be formed, and the plurality of substrates may be disposed in a form flush with one another but the inventive concepts are not limited thereto, and the backlight unit may include a single substrate.

The light emitting device 2160 may include the light emitting device according to the above-described embodiments of the present disclosure. The light emitting devices 2160 may be regularly arranged in a predetermined pattern on the substrate. The light emitting devices 2160 may be arranged in a square shape, or in another form, may be staggered so as not to overlap adjacent light emitting devices 2160.

In addition, a light guide 2210 may be disposed on each of the light emitting devices 2160, thereby improving uniformity of light emitted from the plurality of light emitting devices 2160. The light guide 2210 may be one of materials such as Si, a lens, and a resin including a phosphor. The light guide 2210 may have an upper surface parallel to the base substrate 2180, or may have a convex curved surface.

The diffusion plate 2131 and the optical sheets 2130 are disposed on the light emitting device 2160. Light emitted from the light emitting device 2160 may be supplied to the display panel 2110 in a form of a surface light source via the diffusion plate 2131 and the optical sheets 2130.

As such, the light emitting device according to the embodiments of the present disclosure may be applied to a direct-type display apparatus as the present embodiment.

Figure 15:
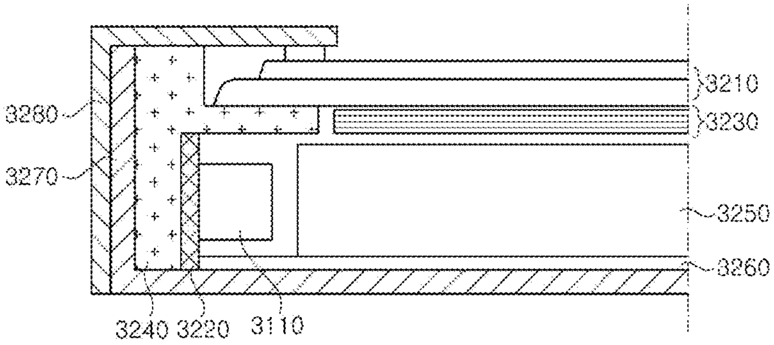
FIG. 15 is a cross-sectional view illustrating a display apparatus to which a light emitting device according to an exemplary embodiment of the present disclosure is applied.

FIG. 15 is a cross-sectional view illustrating a display apparatus to which a light emitting device according to another embodiment of the present disclosure is applied.

The display apparatus having a backlight unit according to this embodiment includes a display panel 3210 on which an image is displayed, and a backlight unit disposed on a rear surface of the display panel 3210 to emit light. Furthermore, the display apparatus includes a frame 3240 supporting the display panel 3210 and accommodating the backlight unit, and covers 3270 and 3280 surrounding the display panel 3210.

The display panel 3210 is not particularly limited, and may be, for example, a liquid crystal display panel including a liquid crystal layer. A gate driving PCB for supplying a driving signal to a gate line may be further disposed at an edge of the display panel 3210. Herein, the gate driving PCB may not be configured in an additional PCB, but may be formed on a thin film transistor substrate. The display panel 3210 is secured by the covers 3270 and 3280 disposed under and over the display panel 3210, and the cover 3270 disposed under the display panel 3210 may be coupled to the backlight unit.

The backlight unit providing light to the display panel 3210 includes a lower cover 3270 having a partially opened upper surface, a light source module disposed on an inner side of the lower cover 3270, and a light guide plate 3250 disposed in parallel with the light source module to convert point light into surface light. In addition, the backlight unit of this embodiment may further include optical sheets 3230 disposed on the light guide plate 3250 to diffuse and condense light, and a reflection sheet 3260 disposed under the light guide plate 3250 to reflect light proceeding in a lower direction of the light guide plate 3250 toward the display panel 3210.

The light source module includes a substrate 3220 and a plurality of light emitting devices 3110 disposed apart from one another at regular intervals on one surface of the substrate 3220. The substrate 3220 is not limited as long as it supports the light emitting device 3110 and is electrically connected to the light emitting device 3110, and may be, for example, a printed circuit board. The light emitting device 3110 may include at least one light emitting device according to the above-described embodiments of the present disclosure. Light emitted from the light source module is incident on the light guide plate 3250 and supplied to the display panel 3210 through the optical sheets 3230. Through the light guide plate 3250 and the optical sheets 3230, a point light source emitted from the light emitting devices 3110 may be transformed into a surface light source.

As such, the light emitting device according to the embodiments of the present disclosure may be applied to an edge-type display apparatus as the present embodiment.

Figure 16:
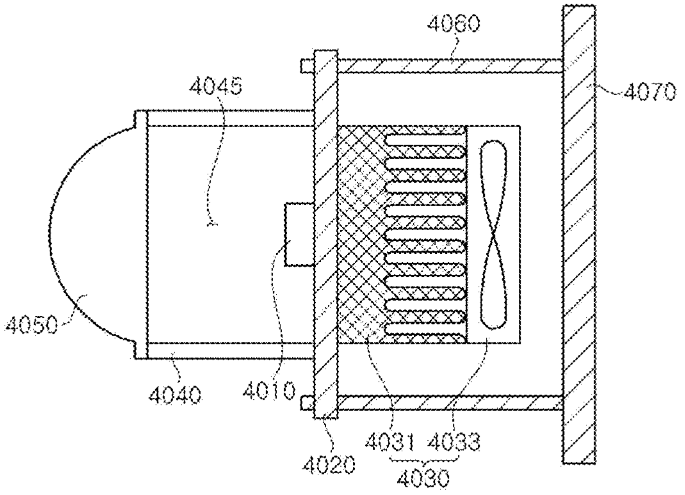
FIG. 16 is a cross-sectional view illustrating an example of applying a light emitting device according to another exemplary embodiment of the present disclosure to a lighting apparatus.

FIG. 16 is a cross-sectional view illustrating an example in which a light emitting device according to another embodiment of the present disclosure is applied to a lighting apparatus.

Referring to FIG. 16, the lighting apparatus includes a lamp body 4070, a substrate 4020, a light emitting device 4010, and a cover lens 4050. Furthermore, the lighting apparatus may further include a heat dissipation unit 4030, a support rack 4060, and a connection member 4040.

The substrate 4020 is secured by the support rack 4060 and disposed apart over the lamp body 4070. The substrate 4020 is not limited as long as it can support the light emitting device 4010, and may be, for example, a substrate having a conductive pattern such as a printed circuit board. The light emitting device 4010 may be disposed on the substrate 4020, and supported and secured by the substrate 4020. In addition, the light emitting device 4010 may be electrically connected to an external power source through the conductive pattern of the substrate 4020. In addition, the light emitting device 4010 may include at least one light emitting device according to the above-described embodiments of the present disclosure.

The cover lens 4050 is disposed on a path along which light emitted from the light emitting device 4010 moves. For example, as shown in the drawings, the cover lens 4050 may be disposed apart from the light emitting device 4010 by the connection member 4040, and disposed in a direction in which light emitted from the light emitting device 4010 is to be provided. A viewing angle and/or color of light emitted from the lighting apparatus to the outside may be adjusted by the cover lens 4050. Meanwhile, the connection member 4040 secures the cover lens 4050 to the substrate 4020, and may serve as a light guide by being disposed to surround the light emitting device 4010 and providing a light emitting path 4045. In this case, the connection member 4040 may be formed of a light reflective material or coated with a light reflective material. Meanwhile, the heat dissipation unit 4030 may include a heat dissipation fin 4031 and/or a heat dissipation fan 4033, and may emit heat generated when the light emitting device 4010 is driven to the outside, but is not limited thereto, and it may not include a component related to heat dissipation.

As such, the light emitting device according to the embodiments of the present disclosure may be applied to a lighting apparatus or a headlamp for a vehicle as in the present embodiment.

Figure 17A:
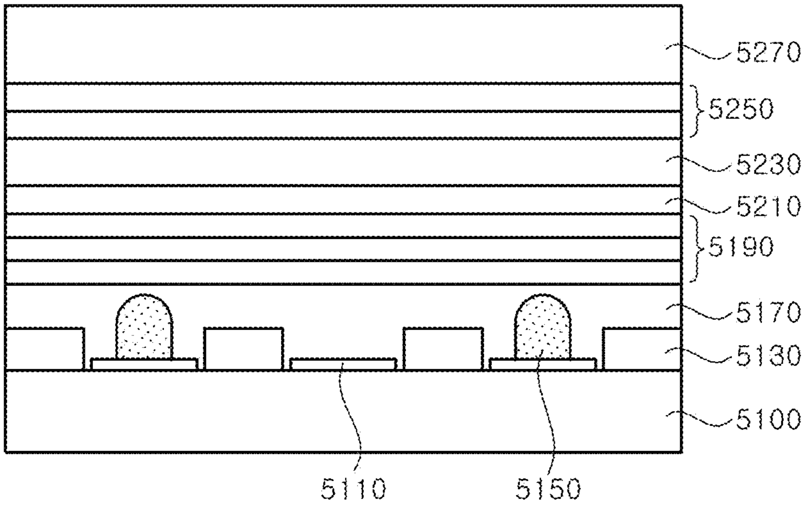
FIGS. 17A, 17B, and 17C are a schematic cross-sectional view, a plan view, and a circuit diagram illustrating a display apparatus using a light emitting device according to another exemplary embodiment of the present disclosure.
Figure 17B:
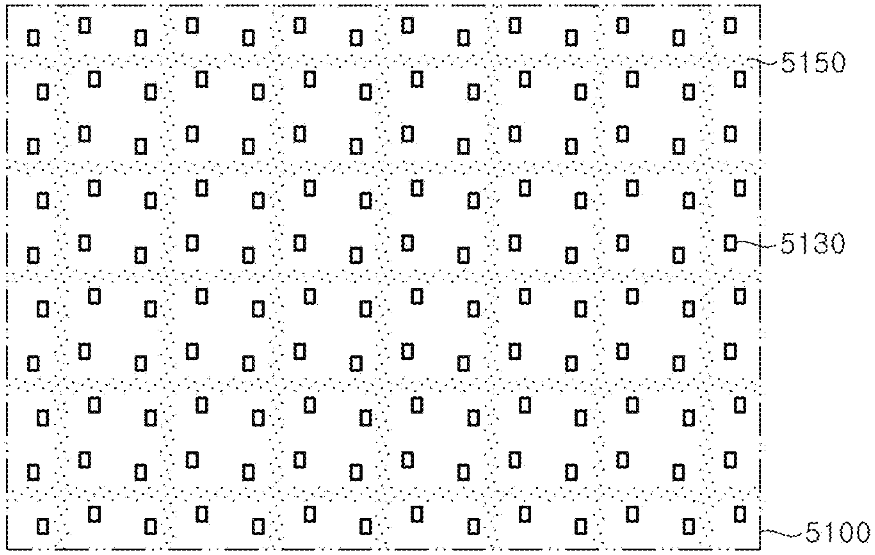
Figure 17C:
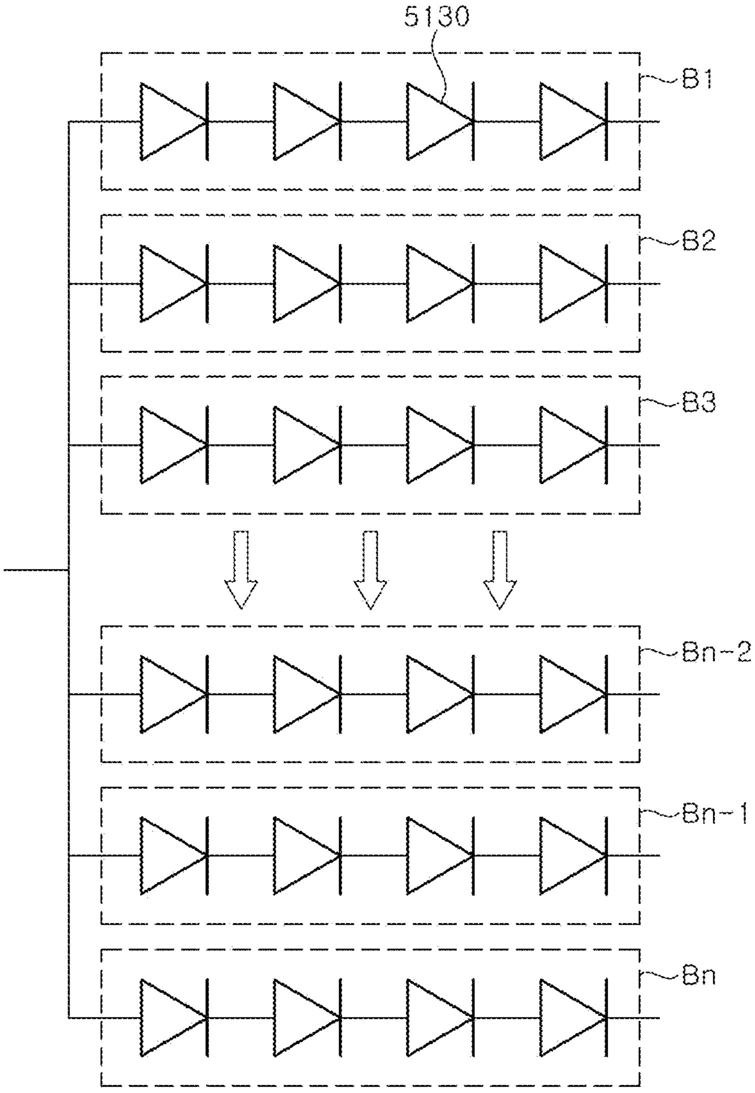

FIGS. 17A, 17B, and 17C are a schematic cross-sectional view, a plan view, and a circuit diagram illustrating a display apparatus to which a light emitting device according to another embodiment of the present disclosure is applied, respectively. FIG. 17A is a partial cross-sectional view of the display apparatus, FIG. 17B is a plan view of a backlight unit, and FIG. 17C is a circuit diagram of the backlight unit.

Referring to FIGS. 17A, 17B, and 17C, the display apparatus of this embodiment includes a display panel 5270 and a backlight unit providing light to the display panel 5270.

The display panel 5270 is not particularly limited, and may be, for example, a liquid crystal display panel including a liquid crystal layer. A gate driving PCB for supplying a driving signal to a gate line may be further disposed at an edge of the display panel 5270. Herein, the gate driving PCB may not be configured in an additional PCB, but may be formed on a thin film transistor substrate.

The backlight unit may include a circuit board 5100, a reflection unit 5110, a light emitting device 5130, a dam portion 5150, a molding member 5170, a diffusion film 5190, and a blue light transmittance (BLT) film, a quantum dot (QD) film 5230, and a brightness enhancement film 5250.

The backlight unit includes a circuit board 5100 and a light source module including a plurality of light emitting devices 5130 disposed on the circuit board 5100. One light source module may be used as the backlight unit, or a plurality of light source modules may be arranged on a plane and used as the backlight unit.

The reflection unit 5110 may be disposed on a surface of the circuit board 5100, as shown in FIG. 17A. The reflection unit 5110 may be provided as a reflection sheet or coated on the circuit board 5100. The reflection unit 5110 may surround the light emitting devices 5130 by being formed around a region where the light emitting devices 5130 are mounted. However, the inventive concepts are not limited thereto, and the light emitting devices 5130 may be disposed on the reflection unit 5110.

The circuit board 5100 has circuits for supplying power to the light emitting devices 5130. The light emitting devices 5130 may be connected in series, parallel, or series-parallel through circuits formed on the circuit board 5100. An electrical connection structure of the light emitting devices 5130 will be described later with reference to FIG. 18C.

The light emitting device 5130 includes at least one light emitting device of the present disclosure described above, and a detailed description thereof will be omitted.

The dam portion 5150 is formed on the circuit board 5100. The dam portion 5150 divides a region on the circuit board 5100 into a plurality of blocks, as shown in FIG. 17B. The plurality of light emitting devices 5130 may be disposed in each of the blocks. For example, in this embodiment, four light emitting devices 5130 are disposed in each of the blocks. However, the inventive concepts are not limited thereto, and more or fewer light emitting devices 5130 than four may be disposed in each of the blocks.

The dam portion 5150 may include a reflective material that reflects light generated by the light emitting devices 5130, and may be formed of, for example, white silicone.

The molding member 5170 fills the blocks partitioned by the dam portion 5150. The molding member 5170 may be formed of transparent silicone. The dam portion 5150 and the molding member 5170 may include silicone of a same series, and may be formed of, for example, phenyl or methyl-based. Since the dam portion 5150 and the molding member 5170 include the same type of silicone, bonding force between the molding member 5170 and the dam portion 5150 may be improved.

The diffusion film 5190 is disposed on the molding member 5170. The diffusion film 5190 diffuses light generated by the light emitting devices 5130 to evenly diffuse light. The diffusion film 5190 may adhere to the molding member 5170, but is not limited thereto, and may be spaced apart from the molding member 5170. The diffusion film 5190 may be composed of one sheet, or may be composed of a plurality of sheets as shown in FIG. 17A.

The BLT film 5210 and the QD film 5230 may be disposed on the diffusion film 5190. The QD film 5230 includes quantum dots that convert light emitted from the light emitting devices 5130, for example, blue light into green light and red light.

The BLT film 5210 transmits light emitted from the light emitting devices 5130, such as blue light, and reflects green light and red light generated from the QD film 5230. Accordingly, it is possible to prevent green light and red light generated from the QD film 5230 from being lost while proceeding toward the circuit board 5100.

Meanwhile, the brightness enhancement film 5250 is disposed on the QD film 5230 to improve brightness of light proceeding to the display panel 5270. The brightness enhancement film 5250 may include lower and upper brightness enhancement films, and may further include a dual brightness enhancement film (DBEF).

As shown in FIG. 17B, the light emitting devices 5130 are disposed in blocks partitioned by the dam portion 5150. The light emitting devices 5130 in a same block may be spaced apart from one another at equal intervals. In addition, the light emitting devices 5130 in adjacent blocks may also be spaced apart at similar intervals. As shown in FIG. 17B, the light emitting devices in one block may be disposed in a tilted shape with respect to a rectangular block.

Meanwhile, as shown in FIG. 17C, the light emitting devices 5130 arranged in each block B1 through Bn may be serially connected to one another. In addition, anodes of the light emitting devices in a first to nth blocks may be connected to one another, and cathodes may be spaced apart from one another. For example, anodes of the light emitting devices in a first block B1 and anodes of the light emitting devices in a second block B2 are connected to one another, and cathodes of the light emitting devices in the first block B1 and cathodes of the light emitting devices in the second block B2 are electrically spaced apart from one another. Accordingly, the light emitting devices 5130 may be independently driven in block units.

According to this embodiment, as the light emitting devices 5130 are independently driven in block units, for example, a black region may be implemented by turning off the light emitting devices 5130. Accordingly, contrast may be implemented more clearly, and power consumption may be reduced compared to a conventional LCD display in which the backlight source is always turned on. Furthermore, by using the QD film, vivid colors may be implemented.

As such, the light emitting device according to the embodiments of the present disclosure may be applied to a mini LED display apparatus as the present embodiment.

Figure 18:
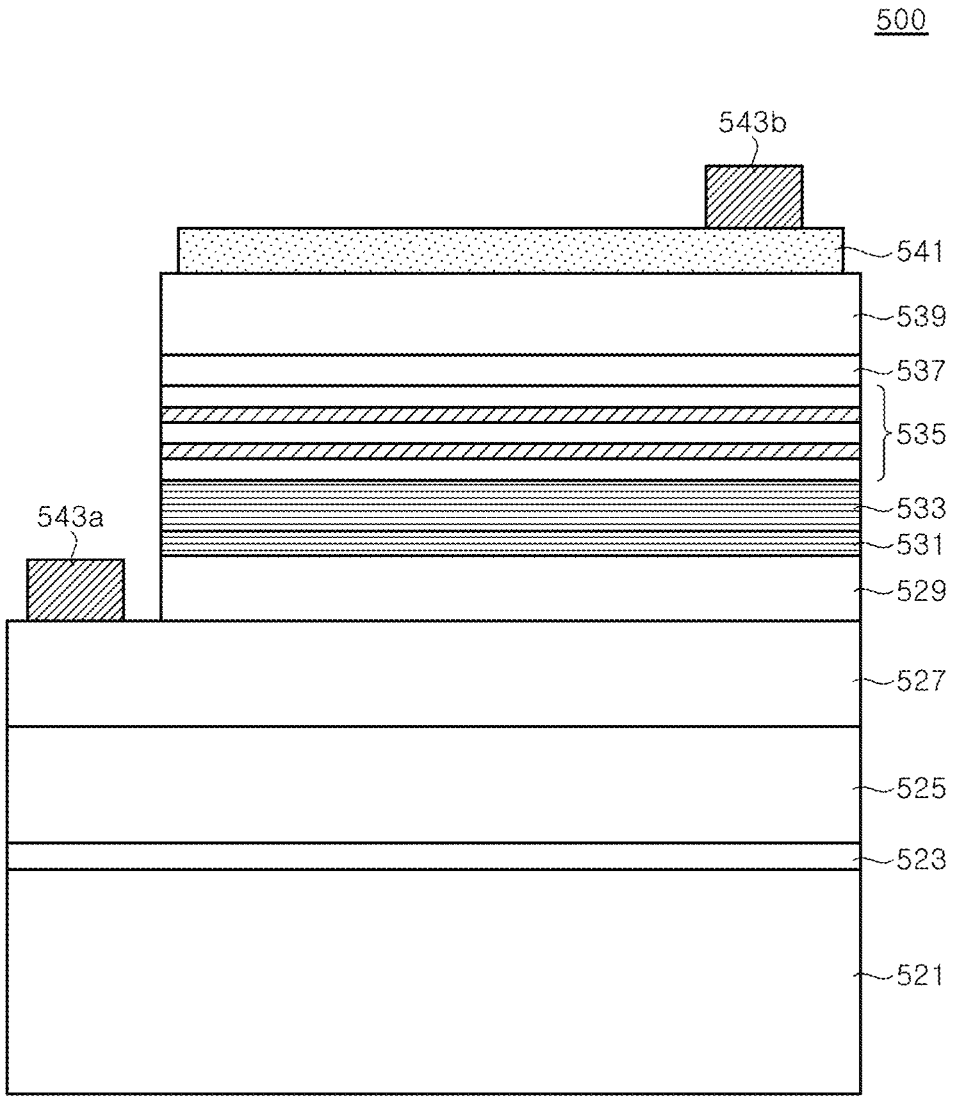
FIG. 18 is a schematic cross-sectional view illustrating a red light emitting diode according to an exemplary embodiment of the present disclosure.

FIG. 18 is a schematic cross-sectional view illustrating a red light emitting diode 500 according to an exemplary embodiment of the present disclosure.

Referring to FIG. 18, the red light emitting diode 500 may include a substrate 521, a buffer layer 523, an undoped layer 525, a first conductivity type semiconductor layer 527, a strain control layer 529, and a lower superlattice. layer 531, an upper superlattice layer 533, an active region 535, an electron blocking layer 537, a second conductivity type semiconductor layer 539, a transparent electrode layer 541, a first electrode 543*a*, and a second electrode 543*b*.

The substrate 521 may be a growth substrate for growing a gallium nitride-based semiconductor layer, for example, a sapphire substrate, a silicon substrate, a SiC substrate, a spinel substrate, or a $Ga_2O_3$ substrate. In an exemplary embodiment, the substrate 521 may be a patterned sapphire substrate. The substrate 521 may be removed from light emitting diode 500.

The buffer layer 523 is a low-temperature buffer layer, for example, a nucleation layer for growing a gallium nitride-based semiconductor layer on a heterogeneous substrate, and may be formed of, for example, an AlGaN layer. The undoped layer 525 is, for example, a high-temperature buffer layer, and may include a gallium nitride-based semiconductor layer, for example, a GaN layer.

The first conductivity type semiconductor layer 527 may be a semiconductor layer including an n-type impurity, for example, Si. The first conductivity type semiconductor layer 527 may be a contact layer on which the first electrode 543*a* is formed.

The first conductivity type semiconductor layer 527 may be represented by a formula 1 below:

(Formula 1) AxByCzD(1-x-y-z), where A may be an element selected from Al, In, and Ga, B may be an element selected from Al, In, and Ga, C may be an element selected from Al, In, and Ga, D may be nitrogen, A, B, and C may be different elements, it may be x+y+z=0.5, and 0≤x, y, z≤0.5.

However, the first conductivity type semiconductor layer 527 may necessarily include Ga and N.

The strain control layer 529 is disposed between the first conductivity type semiconductor layer 527 and the active region 535. The active region 535 includes a high content of In to generate red light by recombination of electrons and holes. Accordingly, a lattice constant of the active region 535 is greater than that of the first conductivity type semiconductor layer 527, and thus, strain occurs in the active region 535. The strain control layer 529 is formed to control the strain generated in the active region 535.

The strain control layer 529 may be formed as a single layer or a multilayer, and may have a thickness, for example, within a range of about 200 nm to 300 nm. The strain control layer 529 may include a V-pit generation layer for generating V-pits. For example, the strain control layer 529 may be formed of a nitride layer of a same composition as that of the first conductivity type semiconductor layer 527, but may be formed at a temperature lower than a growth temperature of the first conductivity type semiconductor layer 527, for example, a temperature of about 700 °C to 900 °C. In particular, the strain control layer 529 may be grown relatively quickly using trimethyl gallium (TMGa) as a Ga source, and may be grown relatively quickly at a relatively low temperature, and thus, a density of threading dislocations may be reduced and the V-pits may be formed.

Figure 19:
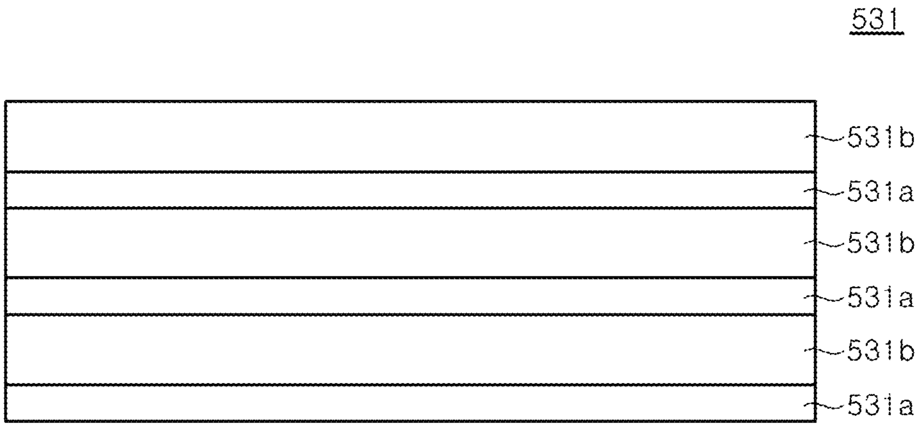
FIG. 19 is an enlarged cross-sectional view of a lower superlattice layer of FIG. 1.

The first superlattice layer 531 may be formed by stacking InGaN/GaN in 3 to 4 cycles. As shown in FIG. 19, a thickness of an InGaN layer 531*a* in the first superlattice layer 531 may be smaller than that of a GaN layer 531*b*. For example, the thickness of the InGaN layer 531*a* may be about 2.5 nm, and the thickness of the GaN layer 531*b* may be about 7.5 nm. A total thickness of the first superlattice layer 531 may be, for example, within a range of 30 nm to 40 nm, without being limited thereto. Meanwhile, with respect to an overall composition of In, Ga, and N, an In composition ratio of InGaN may be within a range of 0.01 to 0.0525, and a composition ratio of Ga may be within a range of 0.475 to 0.49.

Figure 20:
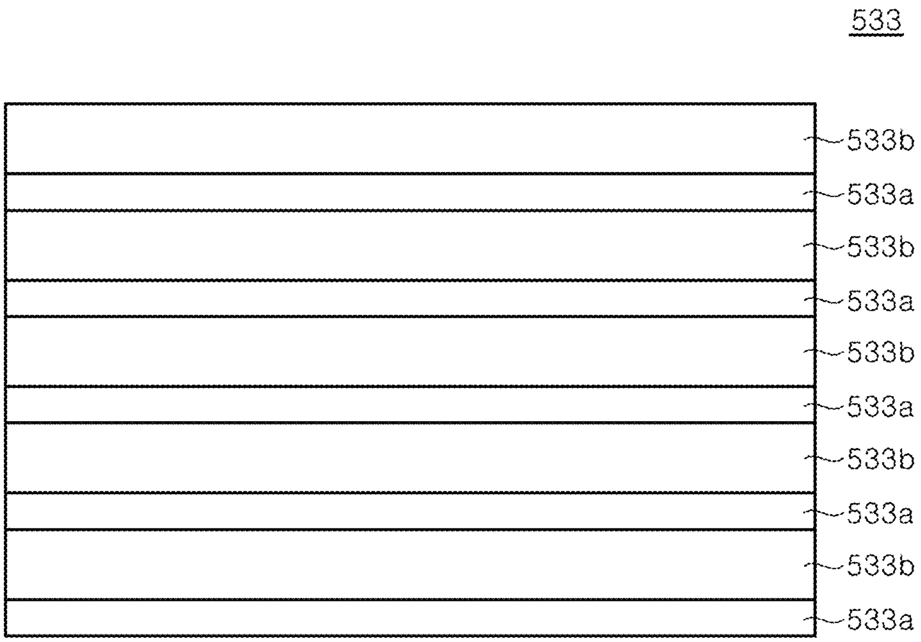
FIG. 20 is an enlarged cross-sectional view of an upper superlattice layer of FIG. 1.

The second superlattice layer 533 may be formed of InGaN/GaN, and may be formed by stacking the layers in more cycles than that of the first superlattice layer 531, for example, 5 to 6 cycles. As shown in FIG. 20, a thickness of an InGaN layer 533*a* in the second superlattice layer 533 may be smaller than a GaN layer 533*b*. In addition, the thickness of the InGaN layer 533*a* in the second superlattice layer 533 may be smaller than the thickness of the InGaN layer 531*a* in the first superlattice layer 531. For example, the thickness of the InGaN layer 533*a* in the second superlattice layer 533 may be about 2.0 nm, and the thickness of the GaN layer 533*b* may be about 8.0 nm. A total thickness of the second superlattice layer 533 may be greater than that of the first superlattice layer 531, for example, may be within a range of about 50 nm to about 60 nm, without being limited thereto.

An In composition ratio of InGaN in the second superlattice layer 533 may be greater than that of InGaN in the first superlattice layer 531. For example, the In composition ratio of InGaN in the second superlattice layer 533 may be within a range of 0.0525 to 0.05 with respect to an overall composition of In, Ga, and N. Meanwhile, a composition ratio of Ga in InGaN in the second superlattice layer 533 with respect to the overall composition of In, Ga, and N may be within a range of 0.45 to 0.475.

The first superlattice layer 531 and the second superlattice layer 533 may be grown at a relatively slow rate using triethylgallium (TEGa) as a Ga source. V-pits are generated by the strain control layer 529 grown relatively quickly at a low temperature, and sizes of the V-pits increase by the first superlattice layer 531 and the second superlattice layer 533. In particular, by growing the first and second superlattice layers 531 and 533 using the TEGa source, V-pits of a relatively uniform density and size may be formed across an entire wafer.

By forming the first superlattice layer 531 and the second superlattice layer 533 with InGaN/GaN superlattice layers of similar structures, defects in the active region 535 may be reduced by reducing lattice changes. In addition, by increasing the In content of the second superlattice layer 533 compared to the first superlattice layer 531, an In content of a well layer 535*b* within the active region 535 may be increased.

The V-pits formed by the strain control layer 529 relieve strain to help more indium be introduced into the active region 535 formed thereon. Accordingly, a quantum well structure containing more indium maybe included in the active region 535 of the light emitting diode 500, and thus, red light may be easily implemented, and a luminous efficiency of red light may be improved.

Figure 21:
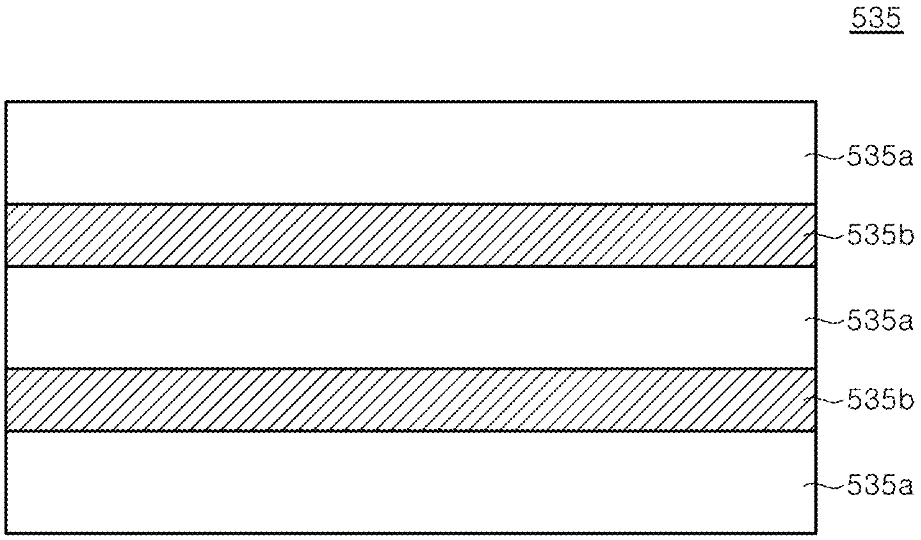
FIG. 21 is an enlarged cross-sectional view of an active layer of FIG. 1.

Referring to FIGS. 18 and 21, the active region 535 is disposed on the second superlattice layer 533. The active region 535 may include a barrier layer 535*a* and the well layer 535*b*. The active region 535 may have a single quantum well structure including a single well layer 535*b* or a multiple quantum well structure including a plurality of well layers 535*b*. For example, the number of well layers 535*b* may range from 1 to 10.

Each of a composition of the barrier layer 535*a* and the well layer 535*b* may be represented by the Formula 1 described above, that is, AxByCzD(1-x-y-z). However, the well layer 535*b* includes a content of In higher than that of the barrier layer 535*a* to emit red light. A composition ratio of In in the well layer 535*b* may be 0.15 or more and 0.2 or less with respect to an overall composition in the well layer 535*b*.

Meanwhile, when mole fractions of In and Ga in each well layer are represented as Min and Mga, respectively, a ratio of the mole fraction of In to the mole fraction of Ga may be represented as Min/Mga. $(Min/Mga)_{well}$ represents a ratio of a mole fraction of In to a mole fraction of Ga in the well layer 535*b*, $(Min/Mga)_{barrier}$ represents a ratio of a mole fraction of In to a mole fraction of Ga in the barrier layer 535*a*. A same may be represented for other layers, for example, a ratio of a mole fraction of In to a mole fraction of Ga in the first conductivity type semiconductor layer 527 may be written as $(Min/Mga)_{first}$, a ratio of a mole fraction of In to a mole fraction of Ga in the second conductivity type semiconductor layer 539 may be written as $(Min/Mga)_{second}$, and a ratio of a mole fraction of In to a mole fraction of Ga in the electron blocking layer 537 may be written as $(Min/Mga)_{EBL}$ In exemplary embodiments of the present disclosure, the ratio of the mole fraction of In to the mole fraction of Ga in each well layer 535*b* and the ratio of the mole fraction of In to the mole fraction of Ga in the first conductivity type semiconductor layer 527 satisfy the following equation 1.

$$0.2 \leq (\text{Min}/Mga)_{well} - (\text{Min}/Mga)_{first} \leq 0.7. \quad \text{(Equation 1)}$$

In addition, in the exemplary embodiments of the present disclosure, the ratio of the mole fraction of In to the mole fraction of Ga in each well layer 535*b* and the ratio of the mole fraction of In to the mole fraction of Ga in the barrier layer 535*a* in contact with each well layer 535*b* satisfy the following equation 2.

$$0.2 \leq (\text{Min}/Mga)_{well} - (\text{Min}/Mga)_{barrier} \leq 0.7. \quad \text{(Equation 2)}$$

Two barrier layers 535*a* may be in contact with each well layer 535*b*, and in this case, the two barrier layers 535*a* may satisfy the Equation 2, respectively. Accordingly, the active region 535 may emit red light.

Furthermore, when the light emitting diode 500 includes the plurality of well layers 535*b*, a sum of differences in ratios of the In mole fraction to the Ga mole fraction in each well layer 535*b* and ratios of the In mole fraction to the Ga mole fraction in the barrier layer 535*b* that is in contact with each well layer may satisfy the following equation 3.

$$0.2 \leq \{(\text{Min}/Mga)_{well\_1} - (\text{Min}/Mga)_{barrier\_1\ or\ 2}\} + \ldots + (\text{Min}/Mga)_{well\_n} - (\text{Min}/Mga)_{barrier\_n\ or\ n+1})\} \leq 7. \quad \text{(Equation 3)}$$

Figure 22:
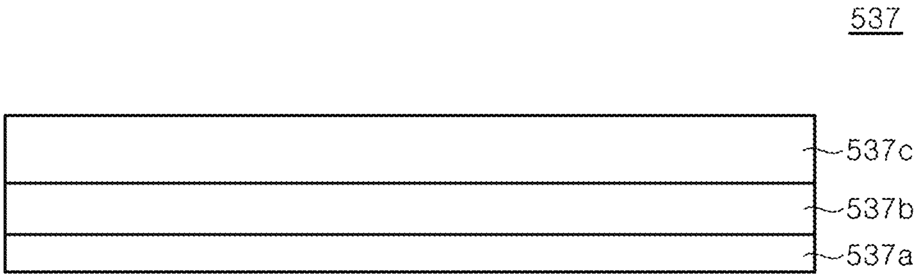
FIG. 22 is an enlarged cross-sectional view of an electron blocking layer of FIG. 1.

The electron blocking layer 537 is disposed on the active region 535. The electron blocking layer 537 is formed along a surface of the active region 535. The electron blocking layer 537 may include a plurality of layers 537*a*, 537*b*, and 537*c*, as shown in FIG. 22. A lowermost layer 537*a* may be in contact with a last barrier layer 535*a* of the active region 535, an uppermost layer 537*c* may be in contact with the second conductivity type semiconductor layer 539, and an intermediate layer 537*b* may be disposed between the lowermost layer 537*a* and the uppermost layer 537*c*. For example, the lowermost layer 537*a* may be formed to have a thickness of approximately 2 nm to 3 nm, the intermediate layer 537*b* may be formed to have a thickness of approximately 10 nm to 15 nm, and the uppermost layer 537*c* may be formed to have a thickness of approximately 12 nm to 20 nm.

The intermediate layer 537*b* may include a concentration of a p-type impurity higher than those of the lowermost layer 537*a* and the uppermost layer 537*c*. For example, the intermediate layer 537*b* may include Mg doped at a high concentration of about $1\times10^{20}/cm^3$ to $3\times10^{20}/cm^3$.

A composition formula of each layer in the electron blocking layer 537 may be represented as the Formula 1 described above. However, each layer in the electron blocking layer 537 may include Al. The lowermost layer 537*a* may be, for example, an AlN layer. In addition, the uppermost layer 537*c* may be a grading layer in which an Al composition ratio decreases as a distance from the active region 535 increases. For example, the uppermost layer 537*c* may be an AlGaN grading layer. In addition, an Al composition ratio of the intermediate layer 537*b* may be smaller than that of the lowermost layer 537*a*, and may be smaller than a maximum Al composition ratio and greater than a minimum Al composition ratio in the uppermost layer 537*c*, which is the grading layer. As an example, the intermediate layer 537*b* may be an InAlGaN layer.

When total mole fractions of In and Gain the electron blocking layer 537 are represented as Min and Mga, the ratio of the mole fraction of In to the mole fraction of Ga in each well layer 535*b* and the ratio of the mole fraction of In to the mole fraction of Ga in the electron blocking layer 537 may satisfy the following equation 4.

$$0.2 \leq (\text{Min}/Mga)_{well} - (\text{Min}/Mga)_{EBL} \leq 0.7. \quad \text{(Equation 4)}$$

The ratio of the mole fraction of In to the mole fraction of Ga in each well layer 535*b* is greater than the ratio of the mole fraction of In to the mole fraction of Ga in an entire electron blocking layer 537.

Meanwhile, when total mole fractions of Al and Ga in the electron blocking layer 537 are represented as Mal and Mga, a ratio of a mole fraction of Al to the mole fraction of Ga in each well layer 535*b* and a ratio of a mole fraction of Al to the mole fraction of Ga in the electron blocking layer 537 may satisfy the following equation 5.

$$(Mal/Mga)_{well} - (Mal/Mga)_{EBL} < 0 \quad \text{(Equation 5)}$$

Meanwhile, the ratio of the mole fraction of In to the mole fraction of Ga in the electron blocking layer 537 and the ratio of the mole fraction of In to the mole fraction of Ga in the first conductivity type semiconductor layer 527 may satisfy the following equation 6.

$$(\text{Min}/Mga)_{EBL} - (\text{Min}/Mga)_{first} > 0. \quad \text{(Equation 6)}$$

Furthermore, the ratio of the mole fraction of Al to the mole fraction of Ga in the electron blocking layer 537 and a ratio of a mole fraction of Al to the mole fraction of Ga in the first conductivity type semiconductor layer 527 may be represented as the following equation 7:

$$(Mal/Mga)_{EBL} - (Mal/Mga)_{first} > 0. \quad \text{(Equation 7)}$$

In addition, a difference between the ratio of the mole fraction of In and Ga contained in the electron blocking layer 537 and the ratio of the mole fraction of In and Ga in the first conductivity type semiconductor layer 527 may be smaller than a difference between the ratio of the mole fraction of Al and the mole fraction of Ga in the first conductivity type semiconductor layer 52 may be represented as the following equation 8.

$$(\mathrm{Min}/Mga)_{EBL} - (\mathrm{Min}/Mga)_{first} < (Mal/Mga)_{EBL} - (Mal/Mga)_{first}. \quad \text{(Equation 8)}$$

The second conductivity type semiconductor layer 539 may be disposed on the electron blocking layer 537. The second conductivity type semiconductor layer 539 may fill V-pits, but the inventive concepts are not limited thereto. For example, the second conductivity type semiconductor layer 539 may be formed along the V-pits, and thus, grooves corresponding to the V-pits may remain on a surface of the second conductivity type semiconductor layer 539.

Figure 23:
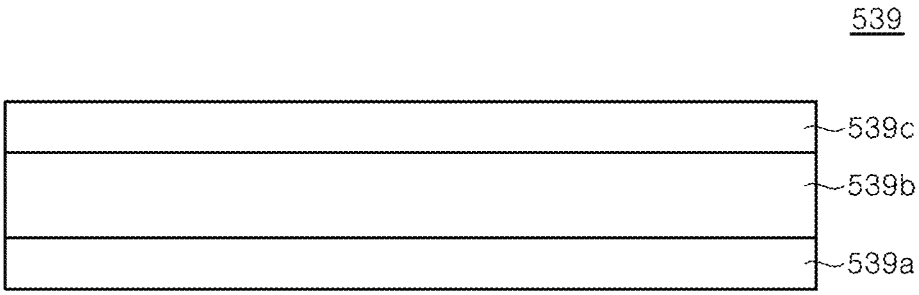
FIG. 23 is an enlarged cross-sectional view of a second conductivity type semiconductor layer of FIG. 1.

The second conductivity type semiconductor layer 539 may be a nitride-based semiconductor layer doped with a p-type impurity, for example, Mg. The second conductivity type semiconductor layer 539 may include, for example, a GaN layer. The second conductivity type semiconductor layer 539 may be a contact layer in which an ohmic electrode is formed. As shown in FIG. 23, the second conductivity type semiconductor layer 539 may include layers 539*a*, 539*b*, and 539*c* having different doping concentrations of p-type impurities such as Mg. A first layer 539*a* may be in contact with the electron blocking layer 537, and an ohmic contact may be formed on a third layer 539*c*. A second layer 539*b* may be disposed between the first layer 539*a* and the third layer 539*c*. The first layer 539*a*, the second layer 539*b*, and the third layer 539*c* may have different doping concentrations from one another. For example, the second layer 539*b* may have a doping concentration higher than that of the first layer 539*a*, and the third layer 539*c* may have a doping concentration higher than that of the second layer 539*b*. The doping concentration of the p-type impurity of the third layer 539*c* may be higher than that of the intermediate layer 537*b* of the electron blocking layer 537, for example, may be a range within $5\times10^{20}/cm^3$ to $9\times10^{20}/cm^3$.

The second layer 539*b* may be thicker than the first layer 539*a* and the third layer 539*c*. For example, the first layer 539*a* and the third layer 539*c* may have a thickness ranging from about 500 nm to about 200 nm, and the second layer 539*b* may have a thickness ranging from about 200 nm to about 300 nm.

Each of the layers 539*a*, 539*b*, and 539*c* of the second conductivity type semiconductor layer 539 may be represented as a formula 1 similarly to the first conductivity type semiconductor layer 527.

(Formula 1) AxByCzD(1-x-y-z), where A may be an element selected from Al, In, and Ga, B may be an element selected from Al, In, and Ga, C may be an element selected from Al, In, and Ga, D may be nitrogen, A, B, and C may be different elements, it may be x+y+z=0.5, and 0≤x, y, z≤0.5.

However, at least one of the first to third layers 539*a* to 539*c* necessarily includes Ga. The first to third layers 539*a* to 539*c* may be formed with a same composition.

The ratio of the mole fraction of In and the mole fraction of Ga included in the second conductivity type semiconductor layer 539 may be smaller than the ratio of the mole fraction of In and the mole fraction of Ga in each well layer 535*b*, and may be represented as the following equation 9.

$$0.2 \leq (\mathrm{Min}/Mga)_{well} - (\mathrm{Min}/Mga)_{second} \leq 0.7. \quad \text{(Equation 9)}$$

In addition, the ratio of the mole fraction of In and the mole fraction of Ga included in the second conductivity type semiconductor layer 539 may be smaller than the ratio of the mole fraction of In and the mole fraction of Ga included in the electron blocking layer 537, and may be represented in the following equation 10:

$$(\mathrm{Min}/Mga)_{EBL} - (\mathrm{Min}/Mga)_{second} > 0. \quad \text{(Equation 10)}$$

Furthermore, a ratio of an mole fraction of Al and the mole fraction of Ga included in the second conductivity type semiconductor layer 539 may be smaller than the ratio of the mole fraction of Al and the mole fraction of Ga included in the electron blocking layer 537, and may be represented as the following equation 11.

$$(Mal/Mga)_{EBL} - (Mal/Mga)_{second} > 0. \quad \text{(Equation 11)}$$

In addition, a difference between the ratio of the mole fractions of In and Ga in the electron blocking layer 537 and the ratio of the mole fractions of In and Ga in the second conductivity type semiconductor layer 539 may be smaller than a difference between the ratio of the mole fractions of Al and Ga in the electron blocking layer 537 and the ratio of the mole fractions of Al and Ga in the second conductivity type semiconductor layer 539, and may be represented as the following equation 12.

$$(\mathrm{Min}/Mga)_{EBL} - (\mathrm{Min}/Mga)_{second} < (Mal/Mga)_{EBL} - (Mal/Mga)_{second}. \quad \text{(Equation 12)}$$

The transparent electrode layer 541 may be disposed on the second conductivity type semiconductor layer 539. The transparent electrode layer 541 may be in ohmic contact with the third layer 539*c*. The transparent electrode layer 541 may be formed of a conductive oxide such as indium tin oxide (ITO) or indium zinc oxide (IZO).

The first electrode 543*a* may be disposed on the first conductivity type semiconductor layer 527. The first electrode 543*a* may be in ohmic contact with the first conductivity type semiconductor layer 527. For example, the first electrode 543*a* may be formed of Cr/Pt/Au.

The second electrode 543*b* may be formed on the transparent electrode layer 541. The second electrode 543*b* may be formed of various metallic layers, and may be formed of a same material as that of the first electrode 543*a*. The first electrode 543*a* and the second electrode 543*b* may be formed of a same material together in a same process.

In this exemplary embodiment, the transparent electrode layer 541 is illustrated and described as being in ohmic contact with the second conductivity type semiconductor layer 539, but the inventive concepts are not necessarily limited thereto, and a metallic layer may be in ohmic contact with the second conductivity type semiconductor layer 539 instead of the transparent electrode layer 541.

According to the exemplary embodiments of the present disclosure, a nitride-based red light emitting diode is provided. The nitride-based red light emitting diode may be used in a lighting apparatus and a display apparatus along with nitride-based blue and green light emitting diodes. The nitride-based red light emitting diode according to the exemplary embodiments of the present disclosure may maintain luminous efficiency even in a size smaller than that of a conventional phosphide-based red light emitting diode, and has low sensitivity to temperature, and thus, it may be suitably used in a micro LED display.

Figure 24:
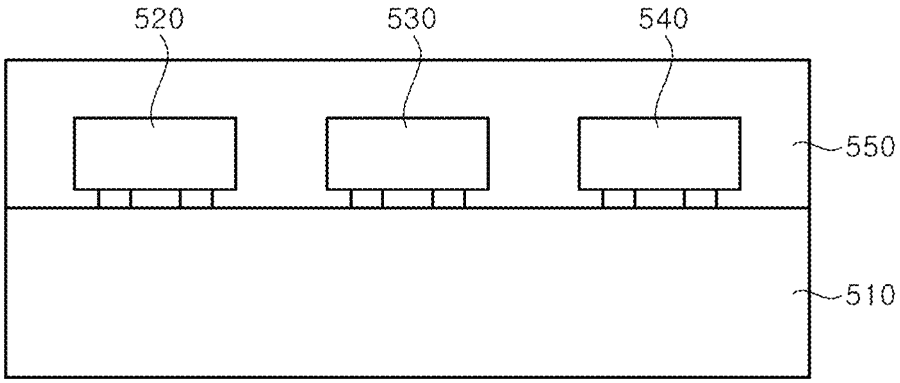
FIG. 24 is a schematic cross-sectional view illustrating a light emitting apparatus according to an exemplary embodiment of the present disclosure.

FIG. 24 is a schematic cross-sectional view illustrating a light emitting apparatus according to an exemplary embodiment of the present disclosure.

Referring to FIG. 24, the light emitting apparatus includes a substrate 110, a first light emitting diode 120 disposed on one side of the substrate 110 and generating light having a first peak wavelength, a second light emitting diode 130 disposed on one side of the substrate 110 and generating light with a second peak wavelength, and a third light emitting diode 140 disposed on one side of the substrate 110 and generating light with a third peak wavelength.

The substrate 110 is a substrate on which a plurality of light emitting diodes 120, 130, and 140 is mounted on an upper surface thereof, and is limited to a specific type, such as a circuit board, a lead frame, a flexible substrate, or a transparent substrate, as long as it can support light emitting diodes.

The first through third light emitting diodes 120, 130, and 140 may emit different peak wavelengths from one another, or may be a plurality of light emitting diodes 120, 130, and 140 having differences in peak wavelengths within 5 nm. At least one of the first through third light emitting diodes 120, 130, and 140 may be a nitride-based light emitting diode emitting red light. In an exemplary embodiment, all of the first through third light emitting diodes 120, 130, and 140 may be nitride-based light emitting diodes emitting red light, and differences in peak wavelengths of light emitted from these light emitting diodes may be within 5 nm. In another exemplary embodiment, the first through third light emitting diodes 120, 130, and 140 may include nitride-based light emitting diodes that emit red light, green light, and blue light. They are shown as the first through third in the drawings, but numbers thereof are not limited thereto.

The substrate 110 is provided with an insulation layer and interconnections for electrical connection with the first through third light emitting diodes 120, 130, and 140, and may include circuits for supplying an electrical source such as current or voltage to the first through third light emitting diodes 120, 130, and 140 and driving them.

A pad for mounting the first through third light emitting diodes 120, 130, and 140 may be formed on the upper surface of the substrate 110, and a pad for another substrate (not shown in the drawings, for example, a display substrate) may be formed on a lower surface of the substrate 110. The substrate 110 may be formed as a single-layer or multi-layer structure, and may be formed to have various thicknesses as needed.

The plurality of light emitting diodes 120, 130, and 140 may be laterally spaced apart on the substrate 110. However, the inventive concepts are not limited thereto, and the first through third light emitting diodes 120, 130, and 140 may be arranged to be vertically stacked.

A cover layer 150 may be formed on the plurality of light emitting diodes 120, 130, and 140. The cover layer 150 may cover the plurality of light emitting diodes 120, 130, and 140, and may further include various fillers, light absorbing materials such as carbon black, light reflecting materials, and the like to increase light extraction efficiency. The cover layer 150 may function as a kind of buffer layer and may cover not only the light emitting diodes but also the upper surface of the substrate 110.

The cover layer 150 may encapsulate the plurality of light emitting diodes 120, 130, and 140, and may function as a refraction layer that refracts light emitted from the light emitting diodes 120, 130, and 140.

The cover layer 150 may be formed of a single layer or multiple layers, and may be a translucent transparent molding for transmitting light emitted from the light emitting diodes 120, 130, and 140.

For example, the cover layer 150 may be formed of a resin including one or more of silicone, epoxy, PMMA (polymethyl methacrylate), and PS (polystyrene) series. In addition, the cover layer 150 may be formed of fluorine resin to improve an efficiency of extracting light emitted from the plurality of light emitting diodes 120, 130, and 140.

Meanwhile, the cover layer 150 may further include a light diffusion material capable of diffusing light emitted from the plurality of light emitting diodes 120, 130, and 140, and for example, the light diffusion material may include one or more of $TiO_2$, BaO, $SiO_2$, MgO, and $Y_2O_3$ capable of scattering light, which may be distributed inside the cover layer 150.

In addition, the cover layer 150 may further include a wavelength conversion material capable of converting wavelengths of light emitted from the plurality of light emitting diodes 120, 130, and 140. For example, the wavelength conversion material may include a fluorescent material capable of emitting one or more of red light, blue light, and green light, and may be distributed inside the cover layer.

Figure 25:
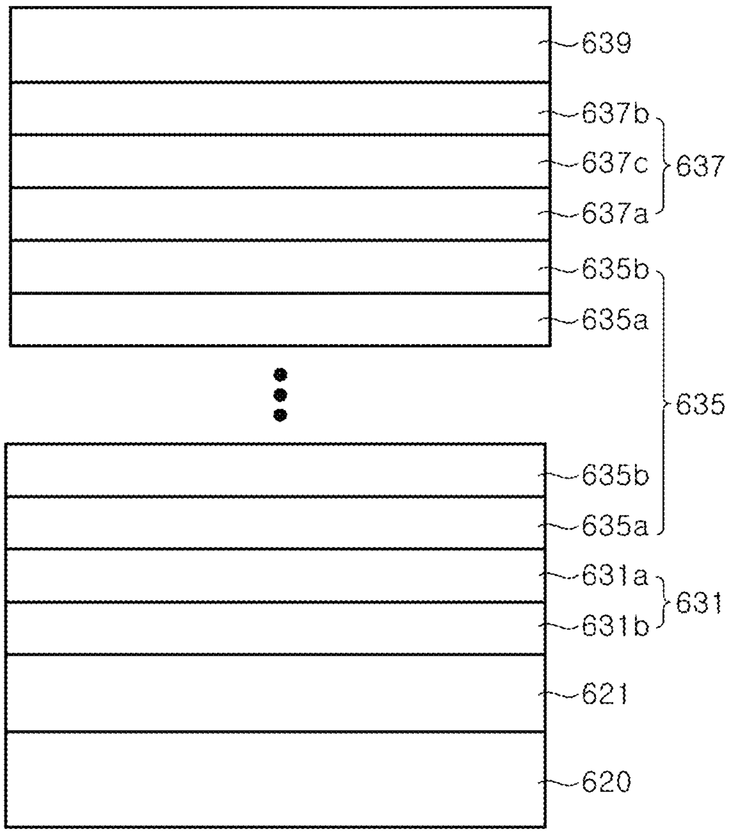
FIG. 25 is a schematic cross-sectional view illustrating a light emitting device according to an exemplary embodiment of the present disclosure.

FIG. 25 is a schematic cross-sectional view illustrating a light emitting diode according to an exemplary embodiment of the present disclosure.

The light emitting diode according to an exemplary embodiment of the present disclosure has a substrate 620, a first type nitride semiconductor layer 621 disposed on the substrate, a sub-active layer 631 disposed on the first type nitride semiconductor layer, a main active layer 635 disposed on the sub-active layer, an electron blocking layer 637 disposed on the main active layer, and a second type nitride layer 639 disposed on the electron blocking layer.

The substrate 620 is used to grow a gallium nitride-based semiconductor layer, and may be, for example, a sapphire substrate, a GaN substrate, a SiC substrate, a Si substrate, a spinel substrate, and the like. The substrate 620 may have protrusions, and may be, for example, a patterned sapphire substrate. However, the present disclosure is not limited thereto, and may be a substrate having a flat upper surface, for example, a sapphire substrate. The substrate 620 may ultimately be removed from the light emitting diode.

The first type nitride semiconductor layer 621 is a nitride-based semiconductor layer doped with an n-type impurity, and may be formed of, for example, an $In_xAl_yGa_{1-x-y}N$ ($0 \le x \le 1$, $0 \le y \le 1$, $0 \le x$ $y<1$) layer doped with Si. A Si doping concentration in an n-type nitride semiconductor layer may be $5\times e^{17}/cm^2$ to $5\times e^{19}/cm^2$. The n-type nitride semiconductor layer may be grown by supplying a metal source gas into a chamber using Metal Organic Chemical Vapor Deposition (MOCVD) technology. In this case, when the first type nitride semiconductor layer 621 is formed on the substrate 620, it may further include a nucleation layer and a high-temperature buffer layer for growing the nitride semiconductor layer. The nucleation layer, the high-temperature buffer layer, and the n-type nitride semiconductor layer may be formed continuously on the substrate, and threading dislocations formed in the high-temperature buffer layer may be transferred to the n-type nitride semiconductor layer.

A first sub-active layer 631_a_ is disposed over the first type nitride semiconductor layer 621. In an embodiment of the present disclosure, the first sub-active layer 631_a_ may include, for example, a plurality of layers with different band gaps from one another. The first sub-active layer 631_a_ may include 3 to 10 pairs, and may include a first layer and a second layer with different band gaps from each other. The first layer may have a higher indium content than the second layer. The first layer may be thinner than the second layer. The second layer may have a thickness twice or more of that of the first layer.

In another embodiment, the light emitting diode may further include a second sub-active layer 631_b_ between the first sub-active layer 631_a_ and the first type semiconductor layer 621. The second sub-active layer 631_b_ may include, for example, a plurality of layers with different band gaps from one another. The second sub-active layer 631_b_ may include 1 to 5 pairs, and may include a first layer and a second layer with different band gaps from each other. The first layer may have a higher indium content than the second layer. The first layer may be thinner than the second layer. The second layer may have a thickness twice or more of that of the first layer.

A number of pairs of the second sub-active layer 631_b_ may be smaller than that of the first sub-active layer 631_a_. Accordingly, the number of pairs is configured to increase as a distance from the first type semiconductor layer 621 increases, so that indium may be efficiently injected into the main active layer 635.

In addition, a number of pairs in the first sub-active layer 631_a_ or the second sub-active layer 631_b_ may be greater than a number of pairs in the main active layer 635.

Both the first sub-active layer 631_a_ and the second sub-active layer 631_b_ may be disposed, or either the first sub-active layer 631_a_ or the second sub-active layer 631_b_ may be selectively disposed.

The main active layer 635 may be disposed over the first sub-active layer 631_a_ or the second sub-active layer 631_b_. The main active layer 635 includes a plurality of well layers 635_b_ and a plurality of barrier layers 635_a_. The well layers 635_b_ and the barrier layers 635_a_ are arranged alternately, and the well layers 635_b_ and barrier layers 635_a_ may be formed of a semiconductor material with a composition formula of $In_xAl_yGa_{1-x-y}N$ ($0 \le x \le 1$, $0 \le y \le 1$, $0 \le x+y<1$), and it includes, for example, at least one of InGaN/GaN, GaN/AlGaN, AlGaN/AlGaN, InGaN/AlGaN, or InGaN/InGaN. One pair formed by one well layer 635_b_ and one barrier layer 635_a_ may be 10 nm to 20 nm, and the main active layer 635 may include 4 to 10 pairs.

The well layer 635_b_ may have an indium content of 25% to 35%, and may have a thickness of 1 nm to 4 nm. A wavelength generated in the well layer 635_b_ may have a peak wavelength within a range of 590 nm to 650 nm. A difference between the indium content (%) of the well layer 635_b_ and that of the first type semiconductor layer 621 may be 25% or more. A difference between the indium content (%) of the well layer 635_b_ and that of the electron blocking layer 637 may be 25% or more. A difference between the indium content (%) of the well layer 635_b_ and that of the second type semiconductor layer 639 may be 25% or more.

The barrier layer 635_a_ may be formed of a semiconductor material with a composition formula of $In_xAl_yGa_{1-x-y}N$ ($0 \le x \le 1$, $0 \le y \le 1$, $0 \le x+y<1$). An indium composition may be 0% or more and 10% or less, and a thickness thereof may be between 5 nm and 10 nm. The barrier layer 635_a_ may have a thickness greater than that of the well layer 635_b_.

In another exemplary embodiment, the barrier layer 635_a_ may include a change region with increased or decreased aluminum content or a different amount from other regions The change region may have a higher aluminum content than other regions of the barrier layer. A thickness of the change region may be 50% or less of that of the barrier layer.

A hydrogen change profile of the main active layer 635 may have a shape different from that of the first type semiconductor layer 621. The hydrogen change profile of the main active layer 635 may have an irregular shape.

The electron blocking layer 637 may be disposed over the main active layer 635. The electron blocking layer 637 may be formed of $In_xAl_yGa_{1-x-y}N$ ($0 \le x \le 1$, $0 \le y \le 1$, $0 \le x\ y<1$) material. The electron blocking layer 637 may include a first layer 637_a_ disposed close to the main active layer 635 and a second layer 637_b_ disposed close to the second type semiconductor layer. An Al composition of the first layer 637_a_ may be higher than that of the second layer 637_b_. A thickness of the first layer 637_a_ may be smaller than that of the second layer 637_b_. A full width at half maximum (FWHM) of an Al composition profile of the first layer 637_a_ may be narrower than that of the Al composition profile of the second layer 637_b_.

In another exemplary embodiment, a third layer 637_c_ may be further disposed between the first layer 637_a_ and the second layer 637_b_. An Al content of the third layer 637_c_ may be less than those of the first layer 637_a_ and the second layer 637_b_. A thickness of the third layer 637_c_ may be greater than that of the first layer 637_a_. Alternatively, the thickness of the third layer 637_c_ may be greater than that of the second layer 637_b_.

A thickness of a layer with a highest Al content in the electron blocking layer 637 may be smaller than that of a layer with a highest Al content in the barrier layer 635_a_.

The second type semiconductor layer 639 may be disposed over the electron blocking layer 637. The second type semiconductor layer 639 is disposed on the main active layer 635. The second type semiconductor layer 639 may be formed of a semiconductor layer doped with a p-type impurity, for example, GaN. A p-type nitride semiconductor layer may be a single layer or a multilayer, and may include a p-type contact layer.

Although some exemplary embodiments have been described above, it should be understood that these embodiments are provided for illustration only and are not to be construed in any way as limiting the present disclosure. It should be understood that features or components of one exemplary embodiment can also be applied to other exemplary embodiments without departing from the spirit and scope of the present disclosure.

I claim:

1. A light emitting diode configured to emit red light, comprising:

a first conductivity type semiconductor layer;

an active region including a barrier layer and a well layer;

a strain control layer disposed between the first conductivity type semiconductor layer and the active region;

a superlattice layer disposed between the strain control layer and the active region;

a second conductivity type semiconductor layer disposed on the active region; and an electron blocking layer disposed between the active region and the second conductivity type semiconductor layer, wherein the first conductivity type semiconductor layer and the well layer are represented by a following Formula (1), and a ratio of a mole fraction of In to a mole fraction of Ga in the first conductivity type semiconductor layer and a ratio of a mole fraction of In to a mole fraction of Ga in the well layer satisfy a following Equation 1:

[Formula (1)] $A_xB_yC_zD_{(1-x-y-z)}$, where A is an element selected from Al, In, and Ga, B is an element selected from Al, In, and Ga, C is an element selected from Al, In, and Ga, D is nitrogen, A, B, and C are different elements from one another, x+y+z=0.5, and 0≤x, y, z≤0.5; and $$0.2 \leq (\mathrm{Min}/Mga)(\mathrm{Min}/Mga) \leq 0.7. \quad \text{[Equation (1)]}$$

2. The light emitting diode of claim 1, wherein the superlattice layer includes a lower superlattice layer and an upper superlattice layer, the lower superlattice layer and the upper superlattice layer are formed of InGaN/GaN, and an In content of the upper superlattice layer is higher than that of the lower superlattice layer.

3. The light emitting diode of claim 2, wherein an InGaN layer in the lower superlattice layer is thicker than an InGaN layer in the upper superlattice layer.

4. The light emitting diode of claim 3, wherein the upper superlattice layer is thicker than the lower superlattice layer.

5. The light emitting diode of claim 1, wherein the ratio of the mole fraction of In to the mole fraction of Ga in the well layer and a ratio of a mole fraction of In to a mole fraction of Ga in the barrier layer in contact with the well layer satisfy the following Equation (2):

$$0.2 \leq (\mathrm{Min}/Mga)\mathrm{well} - (\mathrm{Min}/Mga)\mathrm{barrier} \leq 0.7. \quad \text{[Equation (2)]}$$

6. The light emitting diode of claim 1, wherein the active region includes n well layers and n+1 barrier layers, and a sum of differences between a ratio of a mole fraction of In to a mole fraction of Ga in each well layer and a ratio of a mole fraction of In to a mole fraction of Ga in the barrier layer in contact with each well layer satisfies the following Equation (3):

$$0.2 \leq \{(\mathrm{Min}/Mga)\mathrm{well\_1} - (\mathrm{Min}/Mga)\mathrm{barrier\_1\ or\ 2}\} + \ldots + (\mathrm{Min}/Mga)\mathrm{well\_n} - (\mathrm{Min}/Mga)\mathrm{barrier\_n\ or\ } n+1)\} \leq 7. \quad \text{[Equation (3)]}$$

7. The light emitting diode of claim 1, wherein the ratio of the mole fraction of In to the mole fraction of Ga in the well layer and a ratio of a mole fraction of In to a mole fraction of Ga in the electron blocking layer satisfy the following Equation (4):

$$02 \leq (\mathrm{Min}/Mga)\mathrm{well} - (\mathrm{Min}/Mga)EBL \leq 0.7. \quad \text{[Equation (4)]}$$

8. The light emitting diode of claim 1, wherein a ratio of a mole fraction of Al to the mole fraction of Ga in the well layer and a ratio of a mole fraction of Al to a mole fraction of Ga in the electron blocking layer satisfy the following Equation (5):

$$(Mal/Mga)\mathrm{well} - (Mal/Mga)EBL < 0. \quad \text{[Equation (5)]}$$

9. The light emitting diode of claim 1, wherein a ratio of a mole fraction of In to a mole fraction of Ga in the electron blocking layer and the ratio of the mole fraction of In to the mole fraction of Ga in the first conductivity type semiconductor layer satisfy the following Equation (6):

$$(\mathrm{Min}/Mga)EBL - (\mathrm{Min}/Mga)\mathrm{first} > 0. \quad \text{[Equation (6)]}$$

10. The light emitting diode of claim 1, wherein a ratio of a mole fraction of Al to a mole fraction of Ga in the electron blocking layer and a ratio of a mole fraction of Al to the mole fraction of Ga in the first conductivity type semiconductor layer satisfy the following Equation (7):

$$(Mal/Mga)EBL - (Mal/Mga)\mathrm{first} > 0. \quad \text{[Equation (7)]}$$

11. The light emitting diode of claim 1, wherein a difference between a ratio of a mole fraction of In to a mole fraction of Ga in the electron blocking layer and a ratio of a mole fraction of In to the mole fraction of Ga in the first conductivity type semiconductor layer, and a difference between a ratio of a mole fraction of Al to a mole fraction of Ga in the electron blocking layer and a ratio of a mole fraction of Al to the mole fraction of Ga in the first conductivity type semiconductor layer satisfy the following Equation (8):

$$(\mathrm{Min}/Mga)EBL - (\mathrm{Min}/Mga)\mathrm{first} < (Mal/Mga)EBL - (Mal/Mga)\mathrm{first}. \quad \text{[Equation (8)]}$$

12. The light emitting diode of claim 1, wherein a ratio of a mole fraction of In to a mole fraction of Ga in the second conductivity type semiconductor layer and the ratio of the mole fraction of In to the mole fraction of Ga in the well layer satisfy the following Equation (9):

$$0.2 \leq (\mathrm{Min}/Mga)\mathrm{well} - (\mathrm{Min}/Mga)\mathrm{second} \leq 0.7. \quad \text{[Equation (9)]}$$

13. The light emitting diode of claim 1, wherein a ratio of a mole fraction of In to a mole fraction of Ga in the second conductivity type semiconductor layer and a ratio of a mole fraction of In to the mole fraction of Ga in the electron blocking layer satisfy the following Equation (10):

$$(\mathrm{Min}/Mga)EBL - (\mathrm{Min}/Mga)\mathrm{second} > 0. \quad \text{[Equation (10)]}$$

14. The light emitting diode of claim 1, wherein a ratio of the mole fraction of Al to the mole fraction of Ga in the second conductivity type semiconductor layer and the ratio of the mole fraction of Al to the mole fraction of Ga in the electron blocking layer satisfy the following Equation (11):

$$(Mal/Mga)EBL-(Mal/Mga)\text{second}>0. \quad \text{[Equation (11)]}$$

15. The light emitting diode of claim 1, wherein a difference between a ratio of a mole fraction of In to a mole fraction of Ga in the electron blocking layer and a ratio of a mole fraction of In to a mole fraction of Ga in the second conductivity type semiconductor layer, and a difference between a ratio of a mole fraction of Al to a mole fraction of Ga in the electron blocking layer and a ratio of a mole fraction of Al to a mole fraction of Ga in the second conductivity type semiconductor layer satisfy the following Equation (12):

$$(\text{Min}/Mga)EBL-(\text{Min}/Mga)\text{second}<(Mal/Mga)EBL-(Mal/Mga)\text{second}. \quad \text{[Equation (12)]}$$

16. The light emitting diode of claim 1, wherein the electron blocking layer includes a lower layer in contact with the active region, an upper layer in contact with the second conductivity type semiconductor layer, and an intermediate layer disposed between the lower layer and the upper layer, and the lower layer, the intermediate layer, and the upper layer are a nitride-based semiconductor layer having a different composition from one another.

17. The light emitting diode of claim 16, wherein the upper layer is a grading layer in which a content of Al decreases as a distance from the active region increases.

18. The light emitting diode of claim 17, wherein the lower layer is an AlN layer, the intermediate layer is an InAlGaN layer, and the upper layer is an AlGaN grading layer.

19. The light emitting diode of claim 1, wherein the red light has a peak wavelength within a range of 600 nm to 720 nm.

20. The light emitting diode of claim 1, further comprising: contact electrodes respectively in contact with the first conductivity type semiconductor layer and the second conductivity type semiconductor layer.

* * * * *